US012745434B2

(12) United States Patent
Zou et al.

(10) Patent No.: US 12,745,434 B2
(45) Date of Patent: Sep. 22, 2026

(54) FIELD-EFFECT TRANSISTOR CRESCENT-SHAPED DIELECTRIC ISOLATION

(71) Applicant: INTERNATIONAL BUSINESS MACHINES CORPORATION, Armonk, NY (US)

(72) Inventors: Lijuan Zou, Slingerlands, NY (US); Jay William Strane, Wappingers Falls, NY (US); Junli Wang, Slingerlands, NY (US); Brent A. Anderson, Jericho, VT (US); Ruilong Xie, Niskayuna, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 18/374,881

(22) Filed: Sep. 29, 2023

(65) Prior Publication Data

US 2025/0113560 A1 Apr. 3, 2025

(51) Int. Cl.
*H10D 62/10* (2025.01)
*H10D 30/01* (2025.01)
(Continued)

(52) U.S. Cl.
CPC ......... *H10D 62/115* (2025.01); *H10D 30/014* (2025.01); *H10D 30/43* (2025.01);
(Continued)

(58) Field of Classification Search
None
See application file for complete search history.

(56) References Cited

U.S. PATENT DOCUMENTS 9,171,762 B2 * 10/2015 Huang ................. H10D 62/116
10,840,329 B1 11/2020 Xie et al.
(Continued)

FOREIGN PATENT DOCUMENTS

CN 113658953 A * 11/2021 ......... H10D 84/0186
DE 102020133339 A1 * 1/2022 ............. H10D 84/85
(Continued)

OTHER PUBLICATIONS

Loubet et al., "Stacked Nanosheet Gate-All-Around Transistor to Enable Scaling Beyond FinFET," IEEE, 2017 Symposium on VLSI Technology Digest of Technical Papers, 2017, 2 pages.

*Primary Examiner* — Michael Lebentritt
(74) *Attorney, Agent, or Firm* — David K. Mattheis

(57) ABSTRACT

A semiconductor structure, system, and method of forming a crescent-shaped dielectric isolation layer for stacked field-effect transistors (FETs). The semiconductor structure may include a transistor including an epi. The semiconductor may also include a substrate, where the epi is directly connected to the substrate. The semiconductor may also include an isolation layer directly connected to the epi and the substrate. The system may include a semiconductor structure. The method may include forming an isolation layer directly connected to a substrate. The method may also include forming a first transistor, where forming the first transistor includes growing a first epi, where the first epi is directly connected to the isolation layer and the substrate.

20 Claims, 35 Drawing Sheets

(51) Int. Cl.

| | |
|---|---|
| ***H10D 30/43*** | (2025.01) |
| ***H10D 30/67*** | (2025.01) |
| ***H10D 84/83*** | (2025.01) |
| ***H10W 10/00*** | (2026.01) |
| ***H10W 10/17*** | (2026.01) |

(52) U.S. Cl.
CPC ....... *H10D 30/6757* (2025.01); *H10D 62/121* (2025.01); *H10D 84/83* (2025.01); *H10W 10/0145* (2026.01); *H10W 10/17* (2026.01)

(56) References Cited

U.S. PATENT DOCUMENTS

| | | | | |
|---|---|---|---|---|
| 11,195,911 | B2 | 12/2021 | Xie et al. | |
| 11,233,005 | B1 | 1/2022 | Chen et al. | |
| 11,264,327 | B2 | 3/2022 | Chiang et al. | |
| 11,557,510 | B2 | 1/2023 | Yu et al. | |
| 11,646,235 | B2 | 5/2023 | Miller et al. | |
| 12,266,686 | B2 * | 4/2025 | Liaw | H10D 62/371 |
| 2012/0306014 | A1 * | 12/2012 | Camillo-Castillo | H10D 30/022 257/E29.256 |
| 2013/0228875 | A1 * | 9/2013 | Lee | H01L 21/0262 257/E21.409 |
| 2019/0139830 | A1 * | 5/2019 | Xie | H01L 21/02639 |
| 2020/0126987 | A1 * | 4/2020 | Rubin | H10D 84/0186 |
| 2021/0391421 | A1 | 12/2021 | Chu et al. | |
| 2022/0165730 | A1 * | 5/2022 | Chen | H10D 84/0186 |
| 2022/0278226 | A1 * | 9/2022 | Hall | H10D 30/6757 |
| 2023/0031574 | A1 | 2/2023 | Xie et al. | |
| 2023/0395600 | A1 * | 12/2023 | Xie | H10D 64/018 |
| 2024/0130142 | A1 * | 4/2024 | Sung | H10B 63/80 |
| 2024/0321646 | A1 * | 9/2024 | Lin | H10D 84/0188 |
| 2024/0404950 | A1 * | 12/2024 | Xie | H10D 30/43 |
| 2025/0062190 | A1 * | 2/2025 | Xie | H10D 84/0149 |

FOREIGN PATENT DOCUMENTS

| | | | | | |
|---|---|---|---|---|---|
| DE | 102023101119 | A1 | * | 8/2023 | H10D 30/024 |
| KR | 20020002805 | A | * | 1/2002 | |
| KR | 20160061976 | A | * | 6/2016 | H10D 30/62 |
| KR | 101731587 | B1 | * | 5/2017 | H01L 23/60 |
| TW | 200910467 | A | * | 3/2009 | H10D 84/017 |
| TW | 201626570 | A | * | 7/2016 | H10D 30/792 |
| TW | 202205443 | A | * | 2/2022 | H10D 30/62 |

* cited by examiner

FIELD-EFFECT TRANSISTOR CRESCENT-SHAPED DIELECTRIC ISOLATION

BACKGROUND

The present disclosure relates to semiconductors and stacked transistors and, more specifically, to stacked field-effect transistors (FETs). Semiconductors, such as complementary metal-oxide-semiconductors (CMOS), are commonly used in computer chips and computer technology. These semiconductor chips/devices typically include transistor(s). Transistors are devices which may be used to switch or amplify electric current or voltage.

FETs use an electric field effect to control current flow within a semiconductor. FETs have three terminals—a source, a drain, and a gate. The source introduces/provides current to the transistor, the drain is the terminal that provides the output current, and the gate is used to control the current flow from the source to the drain. Specifically, FETs use the electric charge of their gates to affect and control the current flow through the channel.

Current flows using charge carriers that are either electrons or holes. Electron charge carriers are negatively charged particles (i.e., electrons) that carry charge and create an electric current. Hole charge carriers (referred to herein as holes) are positions on the FET channel that lack an electron (for instance, at positions of positive charge that is equal to the negative charge of an electron and/or positions where an electron could or should be). These holes are positive charges, and they move in an opposite direction of electrons, in some instances. The electric charge and/or voltage of the FET gates is used to control the movements of the electrons and/or holes, which can then affect the current and charge being transmitted through the channel from the source to the drain.

One common type of FET is a finFET. FinFETs, as referred to herein, may be FETs in a vertical fin shape. FinFETs may have vertically stacked channels, and vertically stacked components in general, in order to form the tall, narrow fin shape of a finFET. Another common type of FET is a nanosheet FET. Nanosheet FETs may have multiple nanosheets stacked (for example, vertically and/or horizontally) on top of each other.

SUMMARY

The present disclosure provides a semiconductor structure, system, and method of forming a crescent-shaped dielectric isolation layer for stacked field-effect transistors (FETs). The semiconductor structure may include a transistor including an epi. The semiconductor may also include a substrate, where the epi is directly connected to the substrate. The semiconductor may also include an isolation layer directly connected to the epi and the substrate.

The system may include a semiconductor structure. The semiconductor structure may include a first transistor including a first epi. The semiconductor may also include a second transistor including a second epi. The semiconductor may also include a substrate, where the first epi is directly connected to the substrate. The semiconductor may also include an isolation layer directly connected to the first epi and the substrate.

The method may include forming an isolation layer directly connected to a substrate. The method may also include forming a first transistor, where forming the first transistor includes growing a first epi, where the first epi is directly connected to the isolation layer and the substrate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
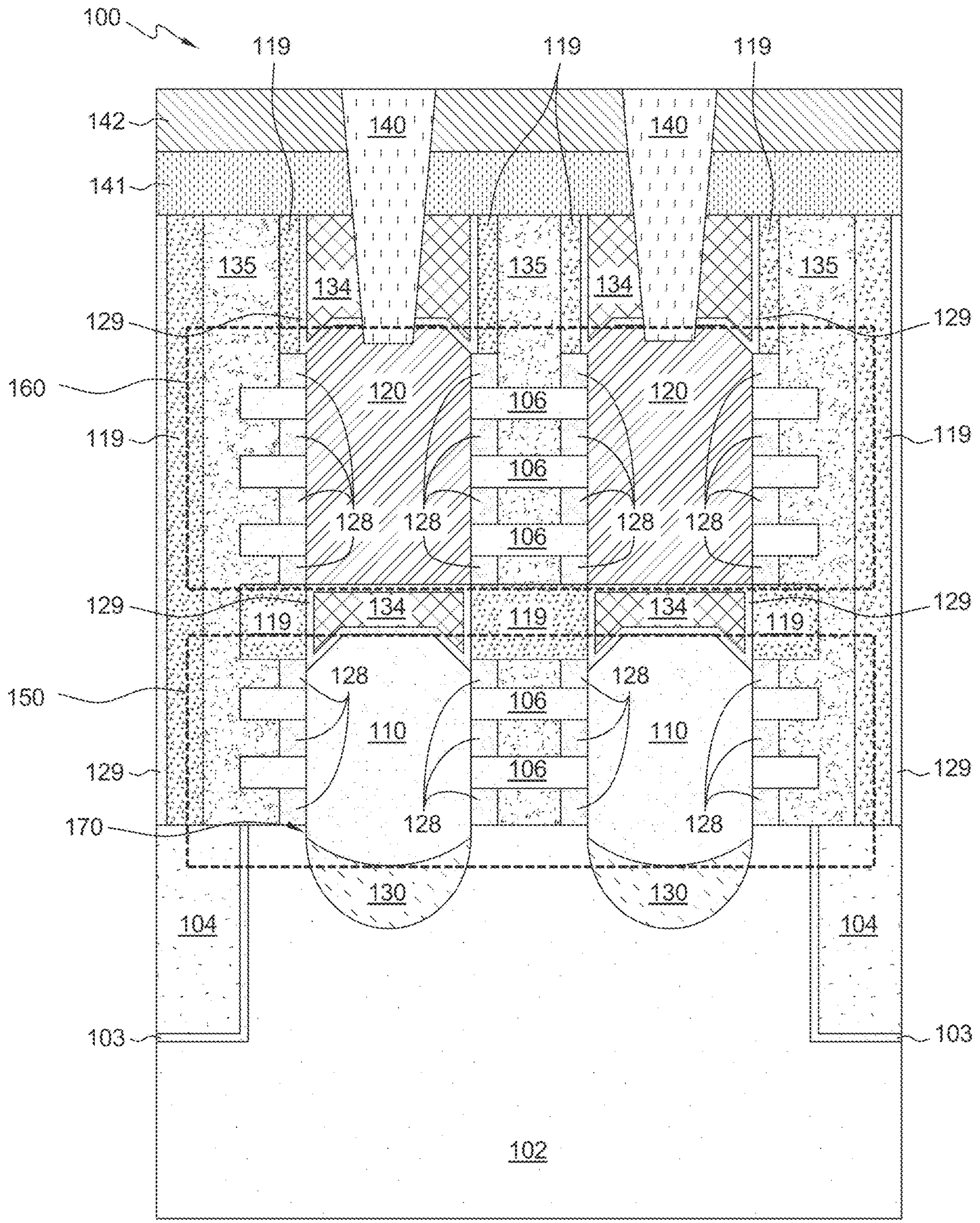
FIG. 1 depicts a cross-sectional view of a stacked FET structure with dielectric isolation layers, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to semiconductors and stacked transistors and, more specifically, to a dielectric isolation layer with partial isolation and partial connection for stacked field-effect transistors (FETs). While the present disclosure is not necessarily limited to such applications, various aspects of the disclosure may be appreciated through a discussion of various examples using this context.

Transistors, such as field-effect transistors (FETs), may be used within a system (for example, within a semiconductor) to switch or amplify electric current or voltage. FETs may have two typical configurations, N-channel FETs and P-channel FETs. N-channel FETs introduce (for example, through doping) an n-type impurity to the semiconductor material of the channel between the source and the drain, and P-channel FETs introduce a p-type impurity to the semiconductor material of the channel.

For n-type impurities, arsenic, phosphorous, or any other n-type material may be added to the silicon. N-type materials may have five electrons in their outer orbitals. When the n-type materials are combined with the silicon of the semiconductor, the fifth electron may not have anything to bond to and may freely move around, which may allow an electric current to flow through the silicon semiconductor channel. Because there are extra electrons from the n-type materials, the majority carrier/charge carrier for N-channel FETs are electrons.

In P-channel FETs, p-type impurities such as boron, gallium, etc., may be added to the silicon semiconductor(s) for the silicon doping. The p-type materials may have three electrons in their outer orbitals which, when added to silicon, may form holes (i.e., may lack electrons) in the valence bonds of the silicon atoms. Because there are holes in the valence bonds due to the p-type materials, the majority carrier/charge carrier for P-channel FETs are holes. An N-channel FET may be referred to herein as an NFET and a P-channel FET may be referred to herein as a PFET.

In some instances, it may be beneficial to have multiple FETs connected to each other. For example, in logic gate designs, an N-gate from an NFET may be electrically connected to a P-gate from a PFET in order to form an input for the logic gate. A logic gate may be a circuit with one or more inputs (for example, any number of inputs), but only one output. In some instances, for example, combining NFET and PFET in a logic gate design can eliminate large current leakage from VDD (a positive supply voltage) to ground in a static/non-switching period, as one of the transistors will be off which may prevent different shorts between VDD and ground. This design is conventionally referred to as a complementary metal-oxide-semiconductor (CMOS) logic design. Because of the benefits of combining NFET and PFET in a logic gate design, various logic designs may include NFET and PFET pairs.

As technology has advanced, it has become increasingly beneficial to have large amounts of technology and components in very small spaces. One method of fitting components in a small area, without reducing the capabilities of the components, is to stack transistors. Stacking transistors may increase the height of the semiconductor chip, but may reduce the area on the chip taken up by transistors. This may help allow for more components on the surface of a chip or may allow for a smaller chip, in some instances. For example, for logic gate designs, the connected NFET and PFET may be stacked on top of each other in order to have the benefit of the NFET-PFET pair (discussed above) while also saving space and reducing the area on the chip taken up by the NFET and PFET.

In conventional stacked transistors, the bottom transistor may be directly connected to a substrate. A bottom transistor, as referred to herein, may be the transistor in which a second transistor (referred to herein as a top transistor) is stacked on top of/above. Below, above, on top of, etc. may refer to components (such as transistors) and their positions when looking at a cross-sectional view such as the views depicted in FIGS. 1-17B.

When the bottom transistor is directly connected to and/or in contact with a substrate, various issues such as junction leakage and parasitic junction capacitance may occur. A junction, as referred to herein, may be an area and/or point where components are connected, joined, and/or in contact with each other. One example occurrence of a junction in stacked FETs is the area where the bottom transistor (for example, the bottom epitaxy (epi) portion) and the substrate connect/come into contact with each other. At the junction of a bottom transistor and a substrate, leakage (referred to herein as junction leakage) can occur due to current diffusion and/or drift near the edges of the components (e.g., the bottom transistor and the substrate) and the area of contact/junction. This can result in current traveling through undesired portions of a semiconductor and/or stacked transistor, which can cause shorts and various other issues to the semiconductor/stacked transistor. In addition, junction leakage can increase energy consumption of the integrated circuit/semiconductor which can reduce energy efficiency and shorten battery life for the semiconductor and/or device.

Parasitic junction capacitance, as referred to herein, is unwanted/undesired capacitance at the junction area. In stacked transistors, junction capacitance may occur at the junction between a bottom transistor and a substrate due to depletion charge between the bottom transistor (for example, the bottom epi portion and/or the source/drain (S/D) region) and the substrate. Put more simply, having multiple components that can carry current and/or hold charge in a close proximity to each other can cause parasitic/unwanted capacitance to occur between the components. Such components may include a bottom transistor and a substrate (e.g., a silicon substrate), for example. This parasitic capacitance may cause capacitance to exist at the junction between the bottom transistor and the substrate, which is an area where capacitance may not be desired/wanted. For instance, it may not be desirable to store charge and/or current between the bottom transistor and the substrate, and the existence of charge and/or current in that area could cause shorts and various other issues to the device. Parasitic capacitance can also increase circuit delays, which can decrease operating frequencies and degrade circuit performance.

The present disclosure relates to semiconductors and stacked transistors and, more specifically, to a crescent-shaped dielectric isolation layer for stacked field-effect transistors (FETs). As discussed herein, junction leakage and parasitic junction capacitance may occur at conventional junctions between a bottom transistor and a substrate in stacked FET structures. To help prevent junction leakage and parasitic junction capacitance, an isolation layer may be deposited between the bottom transistor (for example, a bottom epi portion of the bottom transistor) and a substrate (for example, a silicon (Si) substrate). An isolation layer may help prevent the flow of electric current, which may reduce and/or prevent the current from travelling through the substrate or other undesired portions of the semiconductor (i.e., cutting off the flow/leakage path of current), therefore helping reduce and/or prevent junction leakage. Similarly, as current and charge typically cannot flow through isolation materials, having an isolation material between a bottom transistor and a substrate may help reduce and/or prevent parasitic junction capacitance, as the current carrying components (for example, the bottom transistor and the substrate) are in less close proximity to each other and are separated by an isolation layer.

However, having an isolation layer fully between a bottom transistor and a substrate (such that the bottom transistor and the substrate do not have any direct contact with each other) may cause issues with epi growth for the bottom transistor. For instance, an epi may not be able to have any growth from the isolation layer, therefore a bottom epi (i.e., an epi for a bottom transistor) may only be able to grow from the bottom transistor (for example, the nanosheets) and may not have any growth from the isolation layer. When a bottom transistor is in contact with a substrate (for example, an Si substrate), a bottom epi may have epi growth from both the bottom transistor (for example, nanosheet(s)) and the substrate, as Si can be used in epi growth. Epi growth, as referred to herein, is the formation process of an epi. In some instances, epi(s) may be grown through processes such as chemical vapor deposition (CVD), vapor-phase epitaxy (VPE), and/or any other epi growth technique.

To help prevent/reduce junction leakage and parasitic junction capacitance, while also leaving room for epi growth, an isolation layer that includes partial isolation between a bottom transistor and a substrate and partial connection between a bottom transistor and a substrate is discussed herein. An isolation layer with partial connection between a bottom transistor (e.g., a bottom epi) and a substrate may allow for partial contact between the bottom transistor and the substrate. This partial contact may result in a small amount of exposed sidewalls of the bottom dielectric (for instance, that are not surrounded by dielectric) that are in direct contact with the substrate. The small amount of direct contact between the bottom transistor (particularly the bottom epi portion of the bottom transistor) and the substrate leaves room for epi growth from the substrate (for example, a silicon substrate). This way, the epi is able to grow from both the substrate and the bottom transistor, instead of only having epi growth from the bottom transistor (which can occur when there is full isolation between a bottom transistor and a substrate). Growing an epi from both a substrate and a bottom transistor may result in a better quality epi than an epi grown only from a bottom transistor, as the exposed silicon from the substrate acts as an epi growth seeding layer and helps grow the bottom epi.

In addition, because there is only a small amount of direct contact/connection between the substrate and the bottom transistor, there may be a large amount of direct contact/connection between the bottom transistor and the isolation layer. As discussed herein, an isolation layer that helps isolate a bottom transistor from a substrate can help reduce and/or prevent junction leakage and parasitic junction capacitance. In this instance, even though there may be a small amount of direct contact between a substrate and a bottom transistor, there may still be substantial isolation between the substrate and the bottom transistor due to an isolation layer. This way, the isolation layer may still be largely effective in helping prevent junction leakage and parasitic junction capacitance, while the small area of connection between the substrate and bottom transistor may help with epi growth and may help grow/form a quality bottom epi.

In some instances, as discussed further herein, the isolation layer may be in a crescent shape. The curved shape of a crescent allows room for epi growth (for example, as opposed to a straight-edged isolation layer), while the tapered points of the crescent shape help reduce the amount of exposure/contact between the substrate and the bottom transistor. This way, the bottom epi has room for epi growth/formation while a large amount of isolation can still be maintained between the substrate and the bottom transistor (put differently, direct contact between the substrate and the bottom transistor can still be limited/reduced), which helps reduce/prevent junction leakage and parasitic junction capacitance.

Referring now to FIG. 1, a cross-sectional view of a stacked FET structure 100 with dielectric isolation layers 130 is depicted, according to some embodiments. A stacked FET structure, such as stacked FET structure 100, may also be referred to herein as a semiconductor structure. Stacked FET structure 100 includes a substrate 102 with bottom transistor regions 150 and top transistor regions 160 stacked on top of the substrate 102. Bottom transistor regions 150 and top transistor regions 160 may be referred to herein as bottom transistors 150 and top transistors 160. As discussed herein, a bottom transistor, as referred to herein, may be the transistor in which a second transistor (referred to herein as a top transistor) is stacked on top of/above. A top transistor, as referred to herein, may be the transistor that is stacked on top of/above the bottom transistor. Below, above, on top of, etc. may refer to components (such as transistors) and their positions when looking at a cross-sectional view such as the views depicted in FIGS. 1-17B. In some instances, bottom transistors 150 may be NFETs and top transistors 160 may be PFETs. In some instances, bottom transistors 150 may be PFETs and top transistors 160 may be NFETs. In some instances, substrate 102 may be a material containing silicon (Si). A substrate 102 that is made up of a material containing Si may be referred to herein as a Si substrate 102.

In some instances, the bottom and top transistors (150 and 160, respectively) may include epis, which, in some instances, are the source(s)/drain(s) (referred to herein as S/D(s)) of the transistors. In stacked transistor structure 100, bottom transistors 150 include bottom epis 110 and top transistors 160 include top epis 120. In some instances, bottom epis 110 and top epis 120 may be materials such as silicon germanium (SiGe), silicon (Si), silicon carbide (SiC), etc. In some instances, bottom epis 110 and top epis 120 may be different materials. For instance, the epi materials may correspond to a type of transistor (e.g., NFET or PFET). In some instances, PFETs may include epi materials such as boron-doped or gallium-doped SiGe, and NFETs may include epi materials such as phosphorous-doped or arsenic-doped Si or SiC. Therefore, for example, when the bottom transistors 150 are PFETs and the top transistors 160 are NFETs, bottom epis 110 may be boron- or gallium-doped SiGe and top epis 120 may be phosphorous- or arsenic-doped Si or SiC. In another example, when the bottom transistors 150 are NFETs and the top transistors 160 are PFETs, bottom epis 110 may be phosphorous- or arsenic-doped Si or SiC and top epis 120 may be boron- or gallium-doped SiGe.

Stacked FET structure 100 includes isolation layers 130. Isolation layers 130 may partially isolate bottom transistors 150, specifically bottom epis 110, from the substrate 102. In some instances, isolation layers 130 are material(s) such as silicon nitride (SiN), silicoboron carbonitride (SiBCN), silicon oxycarbonitride (SiOCN), silicon carbide (SiC), silicon oxycarbide (SiOC), etc. As depicted in FIG. 1, isolation layers 130 may isolate a bottom portion (when viewing the stacked FET structure 100 from a cross-section such as depicted in FIG. 1) of bottom epis 110 from the substrate 102, which (as discussed herein), helps reduce parasitic junction capacitance and junction leakage. For instance, the isolation layer 130 may cut/reduce the junction leakage path, as there are only a few small areas (i.e., the small portions of bottom epis 110 directly connected to the substrate 102) at which leakage can occur, as leakage may not occur through the isolation layer 130. One such exposed area is depicted in FIG. 1 as exposed area 170. Having an isolation layer 130 between the bottom transistors 150 (specifically, the bottom epis 110) and the substrate 102 may also help separate current carrying components of the stacked FET structure 100, which may help reduce and/or prevent parasitic junction capacitance.

As discussed herein, isolation layers 130 may not fully isolate bottom epis 110 from substrate 102, and instead may include both partial isolation and partial connection between these components. The partial connection may occur at the small portions of the epis 110 that are directly exposed/connected to substrate 102 (such as exposed portion 170). By including a small amount of exposure/connection between the bottom epis and the substrate, the bottom epis 110 are able to grow from portions of the bottom transistors 150 (such as from nanosheets 106, for example) and from the substrate 102, as the exposed portions of the substrate 102 to the bottom epis 110 (such as exposed portion 170) leave room for epi growth from the substrate 102. This may result in better quality epis, as opposed to an epi that is solely grown from a bottom transistor/nanosheets. In some instances, as depicted in FIG. 1, the portion(s)/amount(s) of the bottom epi(s) 110 directly connected to the isolation layer(s) 130 may be greater than the portion(s)/amount(s) of the bottom epi(s) 110 directly connected to the substrate 102. Put differently, there is a greater connection/contact between the bottom epi(s) 110 and the isolation layer(s) 130 than the connection/contact between the bottom epi(s) 110 and the substrate 102. This may help achieve majority isolation between the bottom epi(s) 110 and the substrate 102, with only a small amount of connection between the bottom epi(s) 110 and the substrate 102.

In some instances, isolation layers 130 may be a crescent shape. A crescent shape for isolation layers 130 may help increase and/or maximize space for bottom epis 110 while also keeping exposure between the bottom epis 110 and the substrate 102 down/to a minimum. Specifically, the tapered points/sidewalls (when viewing isolation layers 130 from the cross-sectional view depicted in FIG. 1) of isolation layers 130 help reduce/keep down the amount of exposure (such as exposed portion 170) between the substrate 102 and the bottom epis 110, while the curved shape of crescent-shaped isolation layers 130 allows room for epi growth for bottom epis 110. In some instances, isolation layers 130 may be any shape that allows for partial isolation and partial connection between the bottom epis 110 and the substrate 102.

In some instances, as depicted herein, bottom transistors 150 and top transistors 160 may include nanosheets 106. In some instances, the nanosheets 106 may include silicon (Si) (or silicon compound) materials. In some instances (not depicted), bottom transistors 150 and top transistors 160 may be other forms of transistors (such as finFET transistors) and, in some instances, may not include nanosheets 106.

Stacked FET structure 100 may include metals 135 (for example, tungsten (W), cobalt (Co), etc.). These metals 135 may be used as contacts in source/drain or gate regions of the bottom transistors 150 and top transistors 160, in some instances. Stacked FET structure 100 may also include various dielectric/dielectric insulator materials (such as dielectric 103, 104, 119, 128, 129, and 134). These various dielectrics may help protect and separate various components of the stacked FET structure 110. In some instances, as depicted in FIG. 1, the various dielectrics (103, 104, 119, 128, 129, and 134) may be different dielectric materials. For instance, different dielectric materials may have different benefits/advantages-therefore it may be beneficial to utilize different dielectric materials depending on their purpose and/or the materials they are surrounding and/or near. For example, dielectric 103 may be a material such as SiN, dielectric 104 may be a material such as an oxide, dielectric 119 may be a material such as silicoboron carbonitride (SiBCN), dielectric 128 may be a material such as SiN, dielectric 129 may be a material such as silicon oxide ($SiO_2$), silicon nitride (SiN), etc., and dielectric 134 may be a material such as an oxide. In some instances, dielectrics 103, 104, 119, 128, 129, and/or 134 may be the same/similar materials. In some instances, the various dielectrics 103, 104, 119, 128, 129, and 134 may help protect the various components of the stacked FET structure 100 and may help insulate/prevent unwanted heat and/or current transfer between components.

In some instances, stacked FET structure 100 includes contacts 140. Contacts 140 may help connect the transistors, such as the top transistor 150, to other components of the semiconductor/device. In some instances, contacts 140 may be a metal material such as cobalt (Co), tungsten (W), etc. In some instances, although only contacts 140 are depicted, stacked FET structure 100 may include any number of contacts. In some instances, as depicted in FIG. 1, stacked FET structure 100 may include dielectric layers 141 and 142 above (for example, when viewing stacked FET structure 100 from the cross-section depicted in FIG. 1) surrounding portions of contacts 140. In some instances, dielectric layers 141 and 142 may surround exposed portions of contacts 140 that are not protected by dielectric 134, dielectric 129, or connected to top epis 120. In some instances, dielectric layers 141 and 142 may be different materials. For example, dielectric 141 may be a material such as SiN, $SiO_2$, etc. and dielectric 142 may be a material such as SiN. In other instances, dielectric layers 141 and 142 may be the same/similar materials.

Stacked FET structure 100 may be an example structure for stacked FETs with dielectric isolation layers for partial isolation and partial connection. For example, although stacked FET structure 100 depicts two stacked transistors (i.e., two bottom transistors 150 and two top transistors 160), any number of transistors (and their corresponding components, such as top and bottom epis (120 and 110, respectively), isolation layers 130, contacts 140, etc.) may be used.

Figure 2:
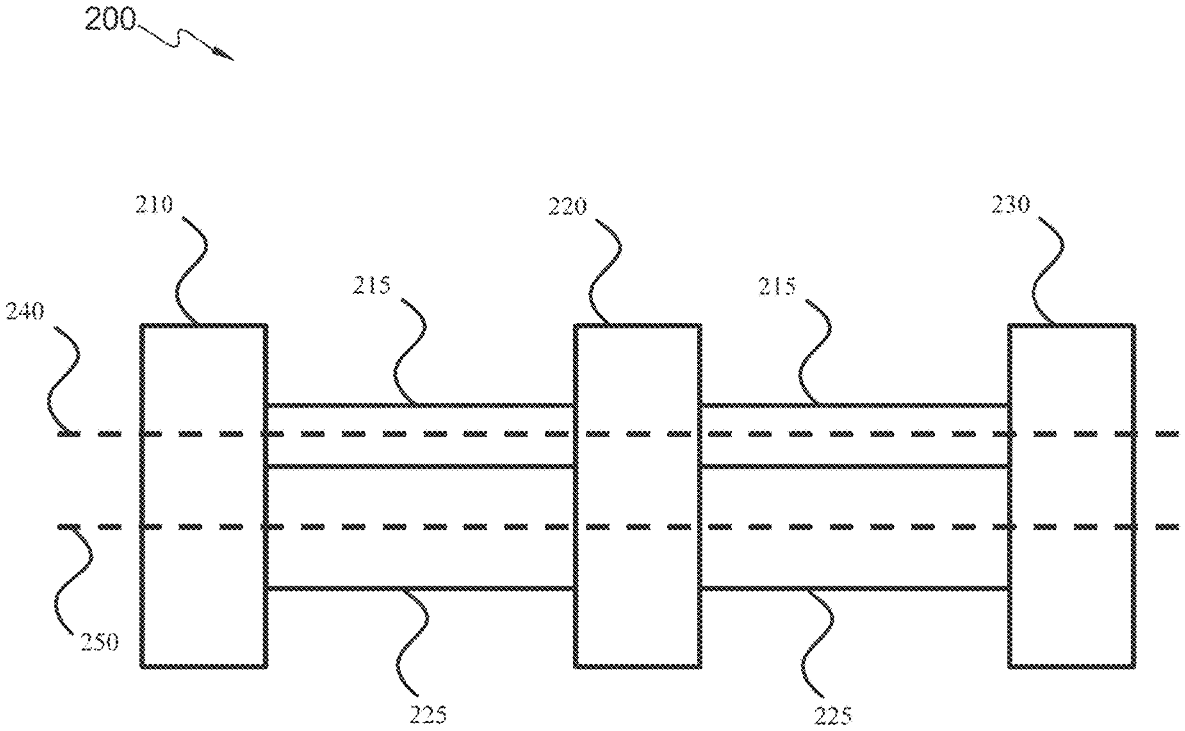
FIG. 2 depicts a top down view of a stacked FET structure with various cross-sections, according to some embodiments.

Referring now to FIG. 2, a top down view of a stacked FET structure 200 with various cross-sections is depicted, according to some embodiments. Stacked FET structure 200 may be the same/similar structure as structures 100 (FIG. 1), 200 (FIG. 2), 300 (FIGS. 3A and B), 400 (FIGS. 4A and B), 500 (FIGS. 5A and B), 600 (FIGS. 6A and B) 700 (FIGS. 7A and B), 800 (FIGS. 8A and B), 900 (FIGS. 9A and B), 1000 (FIGS. 10A and B), 1100 (FIGS. 11A and B), 1200 (FIGS. 12A and B), 1300 (FIGS. 13A and B), 1400 (FIGS. 14A and B), 1500 (FIGS. 15A and B), 1600 (FIGS. 16A and B), 1700 (FIGS. 17A and B), and/or 1800 (FIGS. 18A and B). As discussed further herein, FIGS. 3A-17B may depict intermediate steps in the process of forming a stacked FET structure 1800 (FIG. 18A-B). These figures depict the stacked FET structure and the intermediate steps using various cross-sections, according to some embodiments. FIG. 2 depicts a simplified top down view of a stacked FET structure 200 and its various cross-sections. These cross-sections may be the same/similar cross-sections referenced in FIGS. 3A-18B.

The top down view of a stacked FET structure 200 includes components 210, 220, 230, 215, and 225. The various cross-sectional views referenced herein (and depicted in FIG. 2), include an A view 240 and a B view 250. These may also be referred to herein as cross-section A (240) and cross-section B (250). In some instances, as discussed and depicted further herein, cross-section A 240 may be in a source-drain epi region of a stacked FET structure with both a top and bottom epi, and cross-section B 250 may be in a source-drain epi region with only a bottom epi.

Figure 3A:
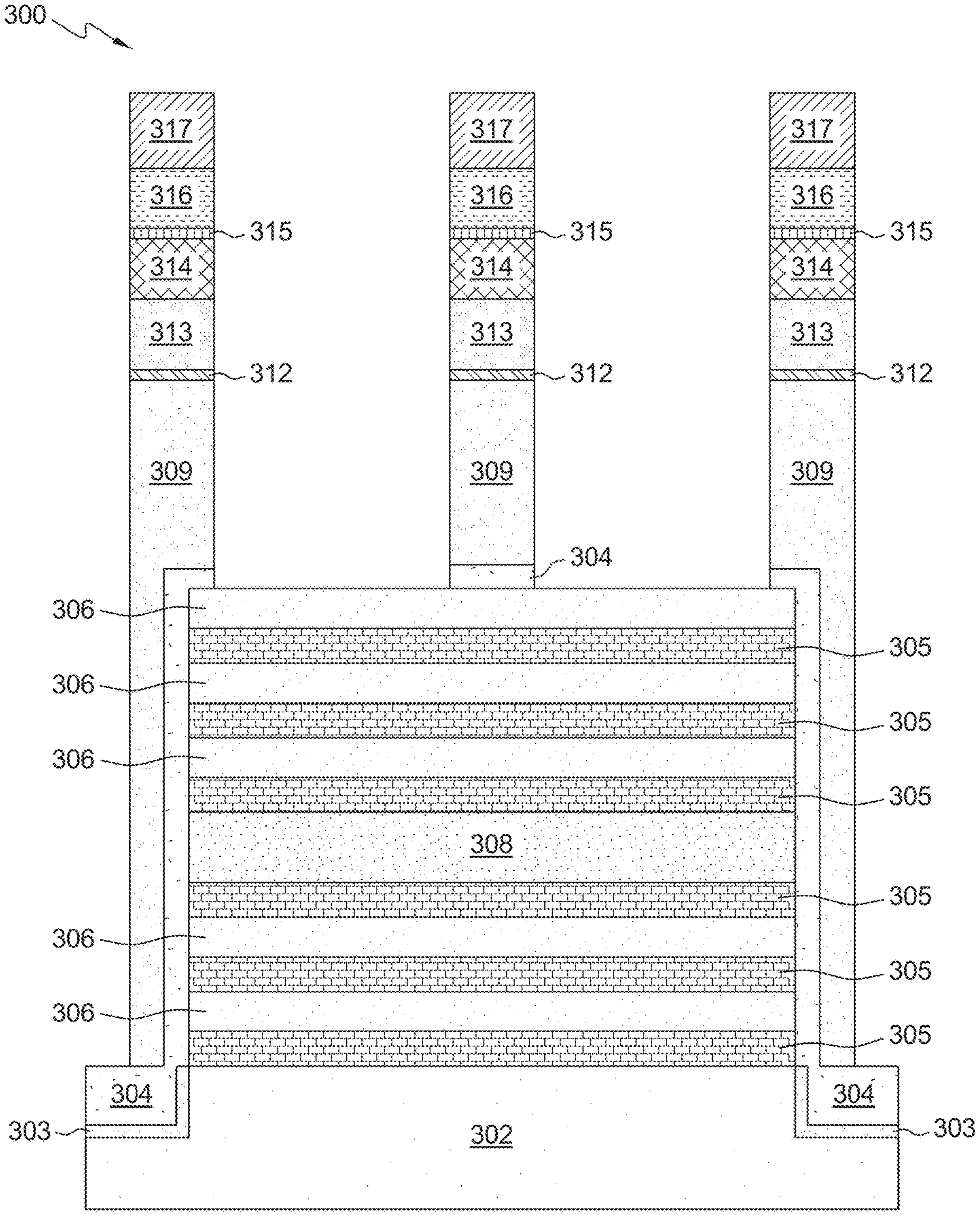
FIGS. 3A-3B depict various cross-sectional views of a first intermediate step of forming a stacked FET structure with dielectric isolation layers, according to some embodiments.

In an example, and in relation to FIGS. 3A and B, components 210, 220, and 230 may correspond to (and be top down views of) dielectric 317, component 215 may correspond to (and be a top down view of) a nanosheet 306, and component 225 may correspond to (and be a top down view of) MDI layer 308.

Referring now to FIGS. 3A-17B, FIGS. 3A-17B depict intermediate steps in the process of forming stacked FET structure 1800 (FIGS. 18A and 18B), according to some embodiments. FIGS. 18A-18B depict the fully formed stacked FET structure 1800 with crescent-shaped dielectric isolation layers, according to some embodiments. Although FIGS. 3A 17B are discussed in relation to stacked FET structure 1800, the same/similar steps may be used to form stacked FET structure 100 (FIG. 1), in some instances.

In some instances, FIGS. 3A, 4A, 5A, 6A, 7A, 8A, 9A, 10A, 11A, 12A, 13A, 14A, 15A, 16A, 17A, and 18A may correspond to an A-cut cross-sectional view in a source-drain epi region of the stacked FET structure(s) such as cross-section A 240 (FIG. 2). FIGS. 3B, 4B, 5B, 6B, 7B, 8B, 9B, 10B, 11B, 12B, 13B, 14B, 15B, 16B, 17B, and 18B may correspond to a B-cut cross-sectional view in a second region of the stacked FET structure(s) parallel to the A-cut cross-sectional view, such as cross-section B 250 (FIG. 2).

Figure 3B:
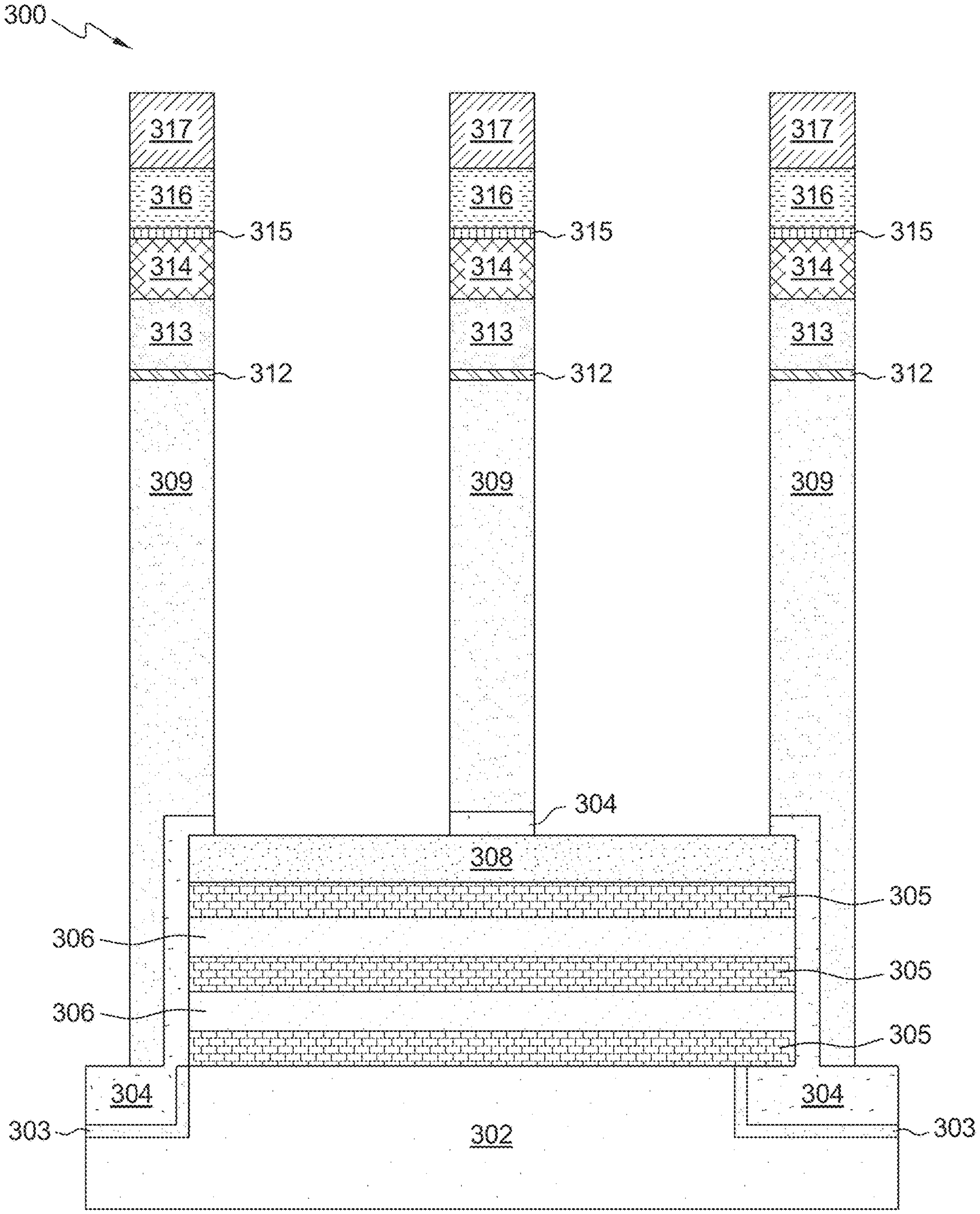

Referring now to FIGS. 3A-3B, various cross-sectional views of intermediate step 300 (also referred to herein as intermediate structure 300) of forming a stacked FET structure with crescent-shaped dielectric isolation layers are depicted, according to some embodiments. Intermediate structure 300 includes a substrate 302 with alternating layers of dielectric 305 and nanosheets 306 (also referred to as nanolayers 306). In some instances, as depicted in FIG. 3A, intermediate structure 300 includes a middle dielectric isolation (MDI) layer 308 between two dielectric layers 305. MDI layer 308 may act as a placeholder isolation layer between a bottom transistor and a top transistor and their corresponding components. For instance, nanosheets 306 may become the nanosheets for the bottom and top transistors, and MDI layer 308 may help keep the separation between the bottom and top transistors and their corresponding nanosheets 306.

In some instances, dielectric 305 and MDI layer 308 may both be dielectric materials. In some instances, both dielectric 305 and MDI layer 308 may be a material such as SiGe, but may have different amounts of germanium. For instance, dielectric 305 may be SiGe 25% (with 25% germanium) and MDI layer 308 may be SiGe 55% (with 55% germanium). This way, MDI layer 308 may be removed without removing dielectric 305, and vice versa, due to the different percentages of germanium, as the removal process(es) can be tailored to the specific germanium content.

In some instances, as depicted, intermediate structure 300 may include dielectric 309. Dielectric 309 may be pillars of dielectric material that act as placeholders of sorts (for instance, so that other components/materials can be formed around dielectric 309) for future components/structures within a stacked FET structure. In some instances, dielectric 309 may be a material such as amorphous silicon (aSi).

Intermediate structure 300 may also include various layers of dielectric (312, 313, 314, 315, 316, and 317) connected to dielectric 309. Specifically, dielectric 312 may be above dielectric 309, dielectric 313 may be above dielectric 312, dielectric 314 may be above dielectric 313, dielectric 315 may be above dielectric 314, dielectric 316 may be above dielectric 315, and dielectric 317 may be above dielectric 316, when viewing intermediate structure 100 from the cross-sectional view depicted in FIGS. 3A and 3B. In some instances, dielectric 312, 313, 314, 315, 316, and 317 may be alternating layers of dielectric material. For instance, dielectric 312, 314, and 316 may be oxide materials, and/or dielectric 313, 315, and 317 may be SiN. In some instances, dielectric 312, 313, 314, 315, 316, and 317 act as layers of hardmask to help protect dielectric 309 and prevent any unwanted etching/removal.

In some instances, intermediate structure 300 includes dielectric 303 and dielectric 304. Dielectric 303 and 304 may correspond to dielectric 103 and 104 (FIG. 1), in some instances.

Figure 4A:
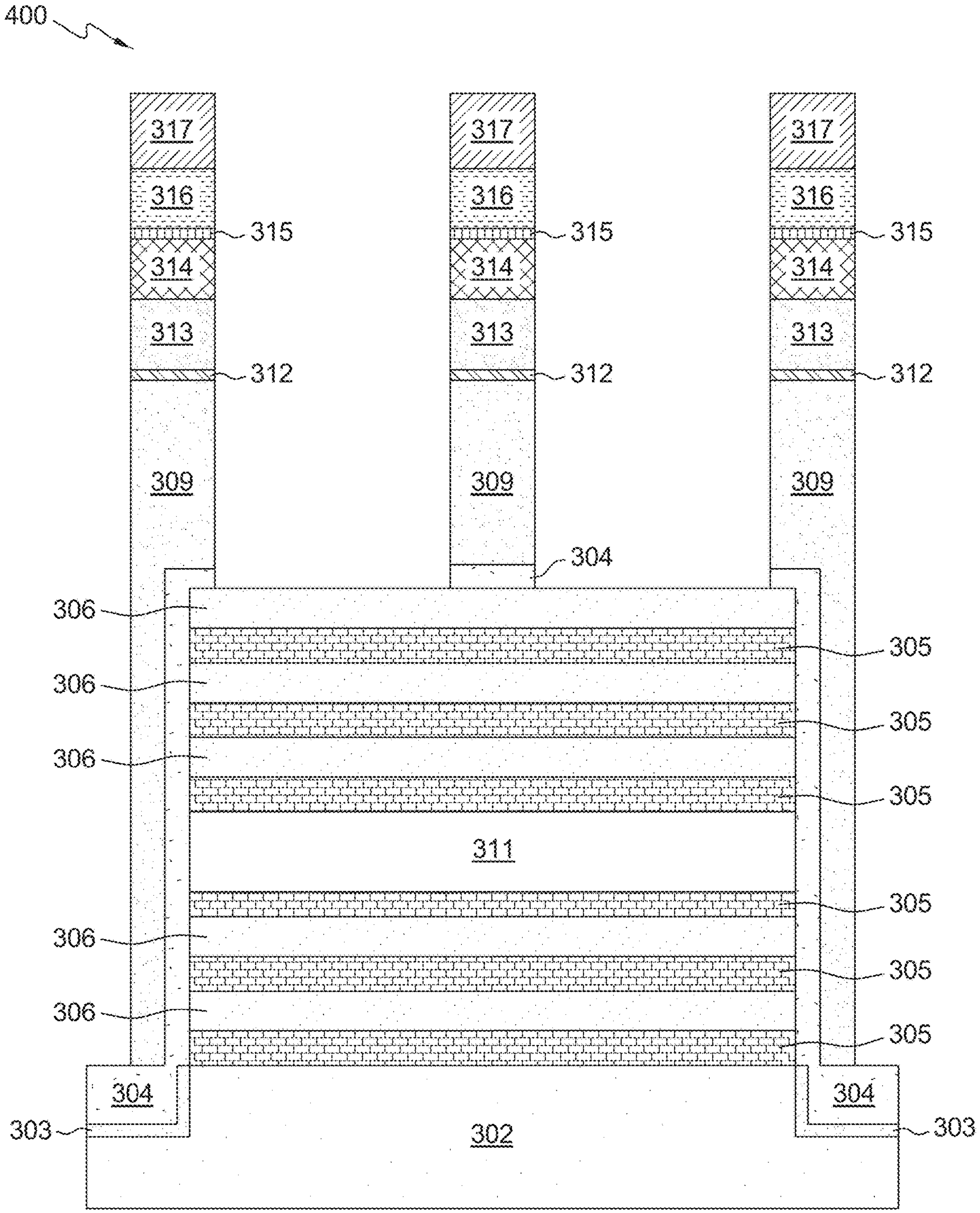
FIGS. 4A-4B depict various cross-sectional views of a second intermediate step of forming a stacked FET structure with dielectric isolation layers, according to some embodiments.
Figure 4B:
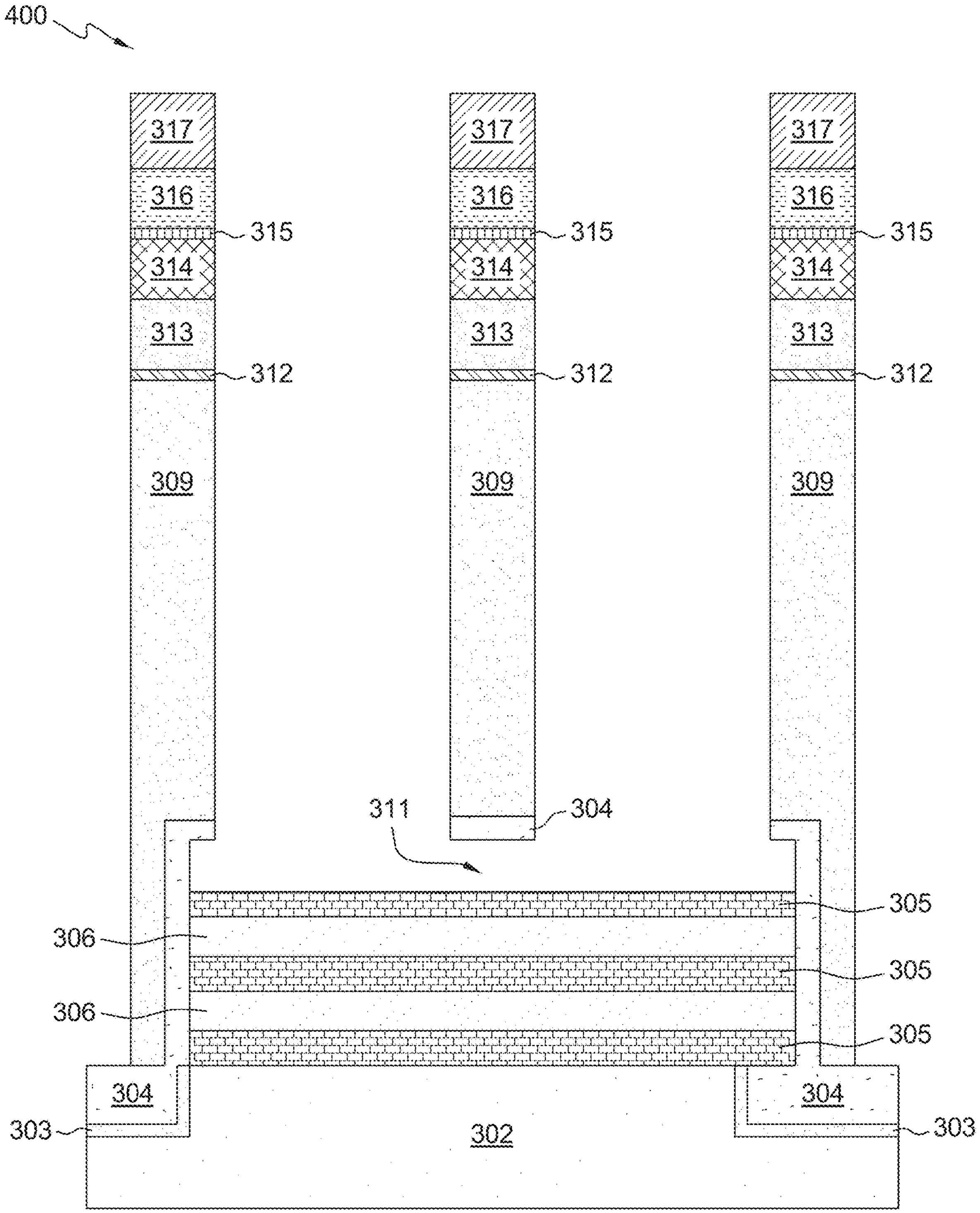

Referring to FIGS. 4A-4B, various cross-sectional views of an intermediate step 400 (also referred to herein as intermediate structure 400) of forming a stacked FET structure with crescent-shaped dielectric isolation layers are depicted, according to some embodiments. In intermediate step 400, MDI 308 is removed, resulting in opening 311. The removal of MDI 308 may also be referred to as an MDI (308) release. In some instances, MDI 308 is removed using a dry etch such as a chemical vapor etch (CVE) or any other patterning/etching process. A dry etch such as a CVE is able to etch MDI 308 without removing other components of intermediate structure 400. For example, when MDI 308 is SiGe 55% and dielectric 305 is SiGe 25%, a CVE using a gas such as hydrochloric acid (HCl) gas can remove/etch SiGe 55% (MDI 308, in this example) without removing other components such as the SiGe 25% dielectric 305 because of the different Ge concentrations.

Figure 5A:
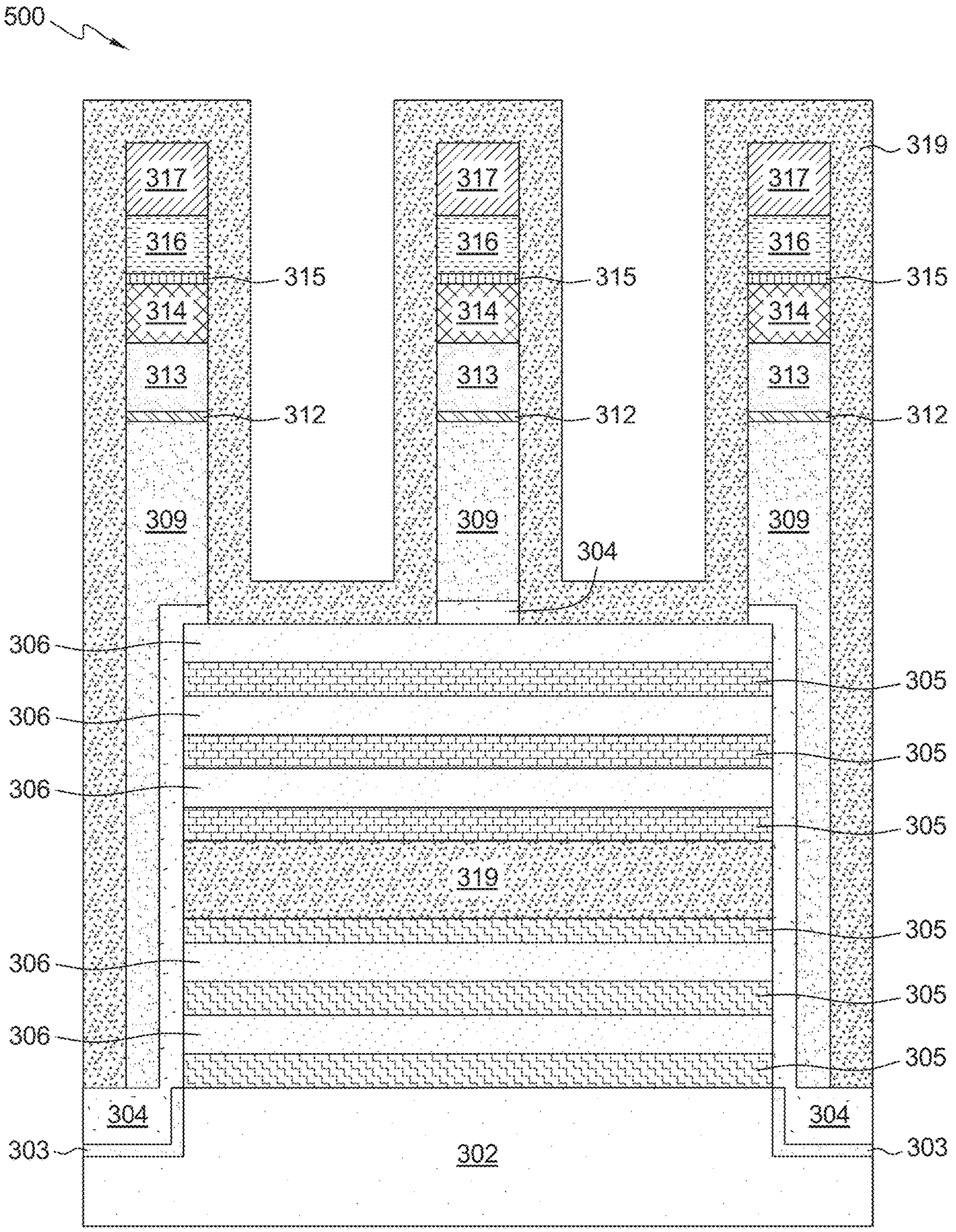
FIGS. 5A-5B depict various cross-sectional views of a third intermediate step of forming a stacked FET structure with dielectric isolation layers, according to some embodiments.
Figure 5B:
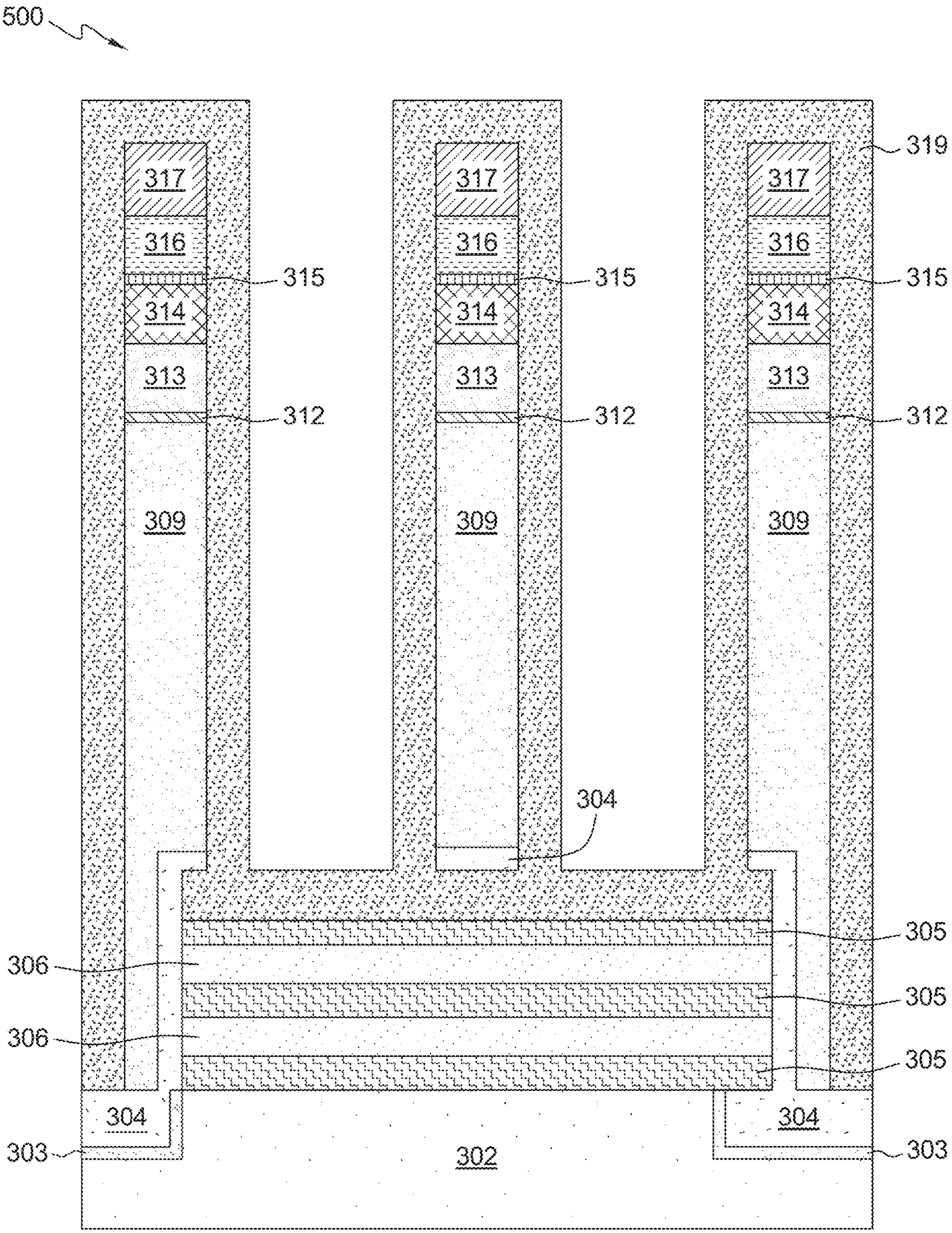

Referring to FIGS. 5A-5B, various cross-sectional views of an intermediate step 500 (also referred to herein as intermediate structure 500) of forming a stacked FET structure with crescent-shaped dielectric isolation layers are depicted, according to some embodiments. In intermediate step 500, spacer 319 is deposited. In some instances, as depicted in FIGS. 5A and 5B, spacer 319 may be deposited on exposed sidewalls/components of the structure (such as dielectrics 304, 309, 312, 313, 314, 315, 316, and 317) and in opening 311 (depicted in FIGS. 4A and 4B). Spacer 319 may be used in the process of forming a stacked FET structure (such as stacked FET structure 1800 (FIGS. 18A and 18B) and/or stacked FET structure 100 (FIG. 1)) to help achieve the proper and/or necessary placement and spacing between the various components of a stacked FET structure. In some instances, spacer 319 may be a material such as silicon boron carbonitride (SiBCN), SiN, silicon oxynitride (SiON), silicon carbonate (SiCO), etc. In some instances, spacer 319 is deposited through methods such as atomic layer deposition (ALD), chemical vapor deposition (CVD), laser induced chemical vapor deposition (LCVD), and/or any other deposition technique.

Figure 6A:
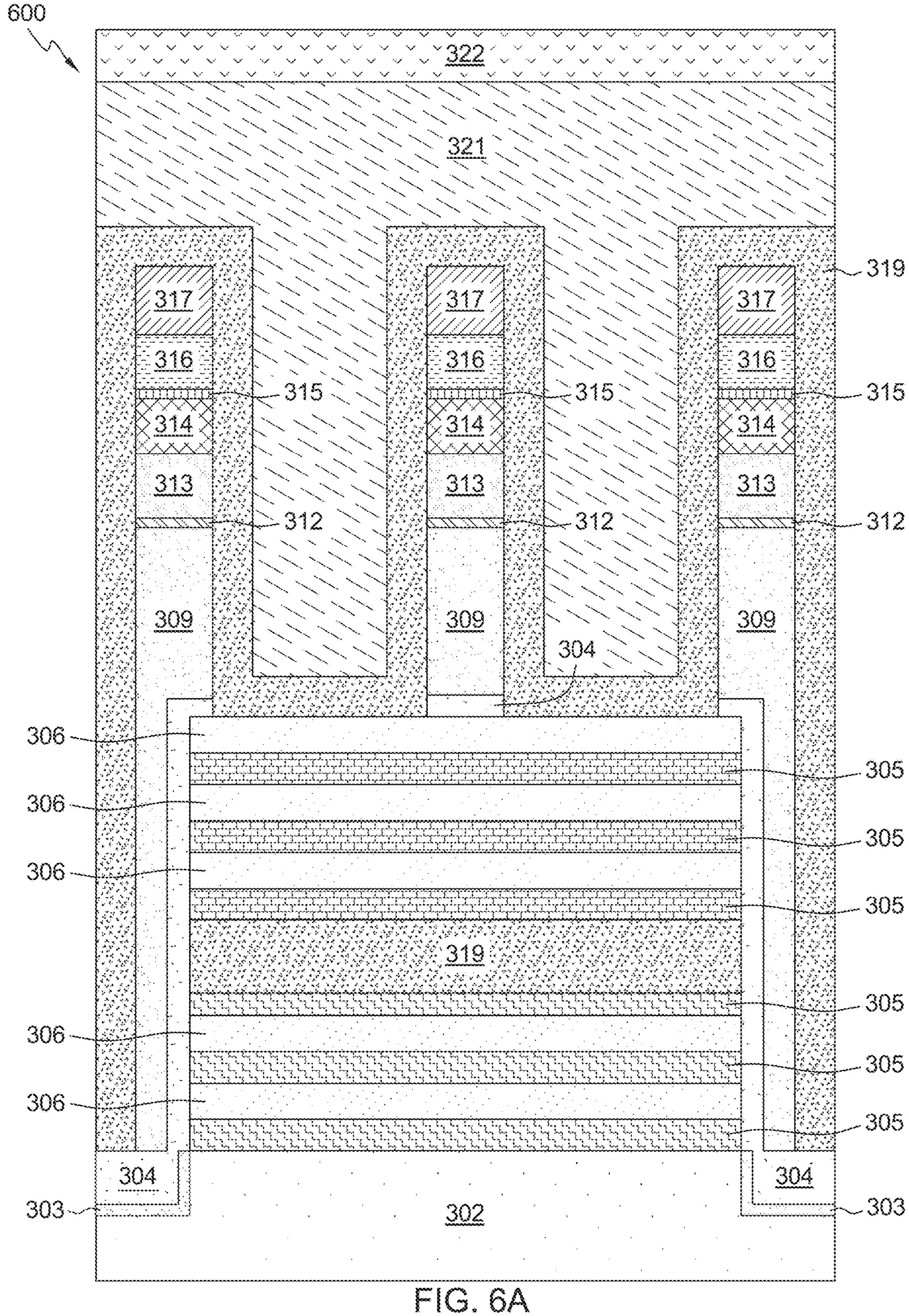
FIGS. 6A-6B depict various cross-sectional views of a fourth intermediate step of forming a stacked FET structure with dielectric isolation layers, according to some embodiments.
Figure 6B:
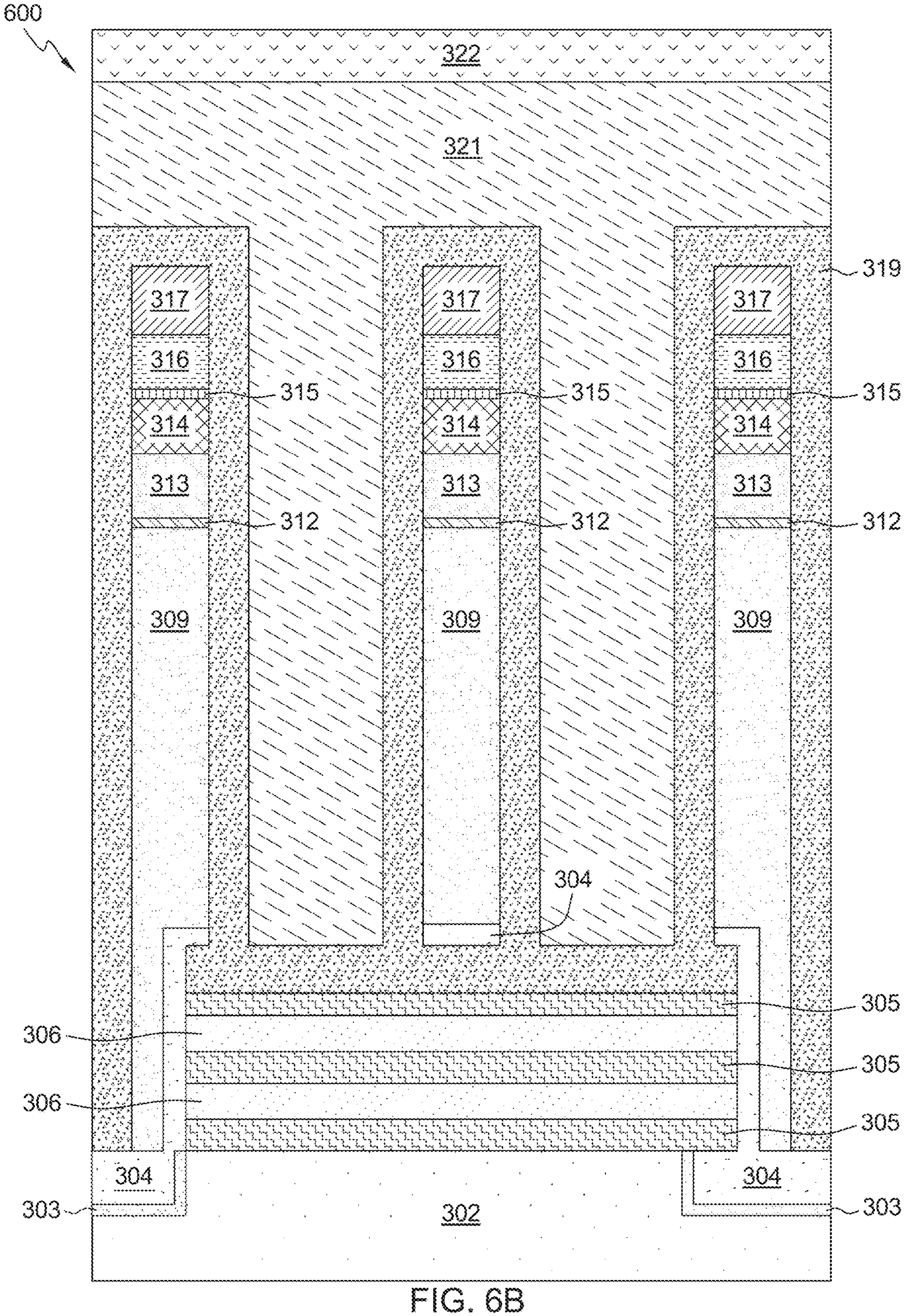

Referring to FIGS. 6A-6B, various cross-sectional views of an intermediate step 600 (also referred to herein as intermediate structure 600) of forming a stacked FET structure with crescent-shaped dielectric isolation layers are depicted, according to some embodiments. Intermediate step 600 may include depositing dielectric 321 and dielectric 322, in some instances. In some instances, dielectric 321 is a different material than other dielectrics (such as dielectrics 304, 309, 312, 313, 314, 315, 316, and 317) in intermediate structure 600. For example, dielectric 321 may be spin-on glass (SOG), in some instances. Therefore, dielectric 321 may also be referred to herein as SOG 321. SOG 321 may be a mixture of silicon dioxide ($SiO_2$) and a dopant (for example, boron or phosphorous) and may be an interlayer dielectric material that helps fill various gaps in intermediate structure 600, in some instances. In some instances, SOG 321 is deposited through spin-coating.

Dielectric 322 may be deposited above (for example, when viewing from the cross-sections depicted in FIGS. 6A and 6B) SOG 321. In some instances, dielectric 322 is a high aspect ratio process (HARP) (i.e., a type of oxide film), referred to herein as HARP 322. In some instances, HARP 322 may be deposited through CVD, ALD, LCVD, and/or any other deposition technique. HARP (such as HARP 322) may have a higher density than SOG (such as SOG 321), which may be better for chemical mechanical planarization (CMP) (which occurs in intermediate step 700 (FIGS. 7A-7B).

Figure 7A:
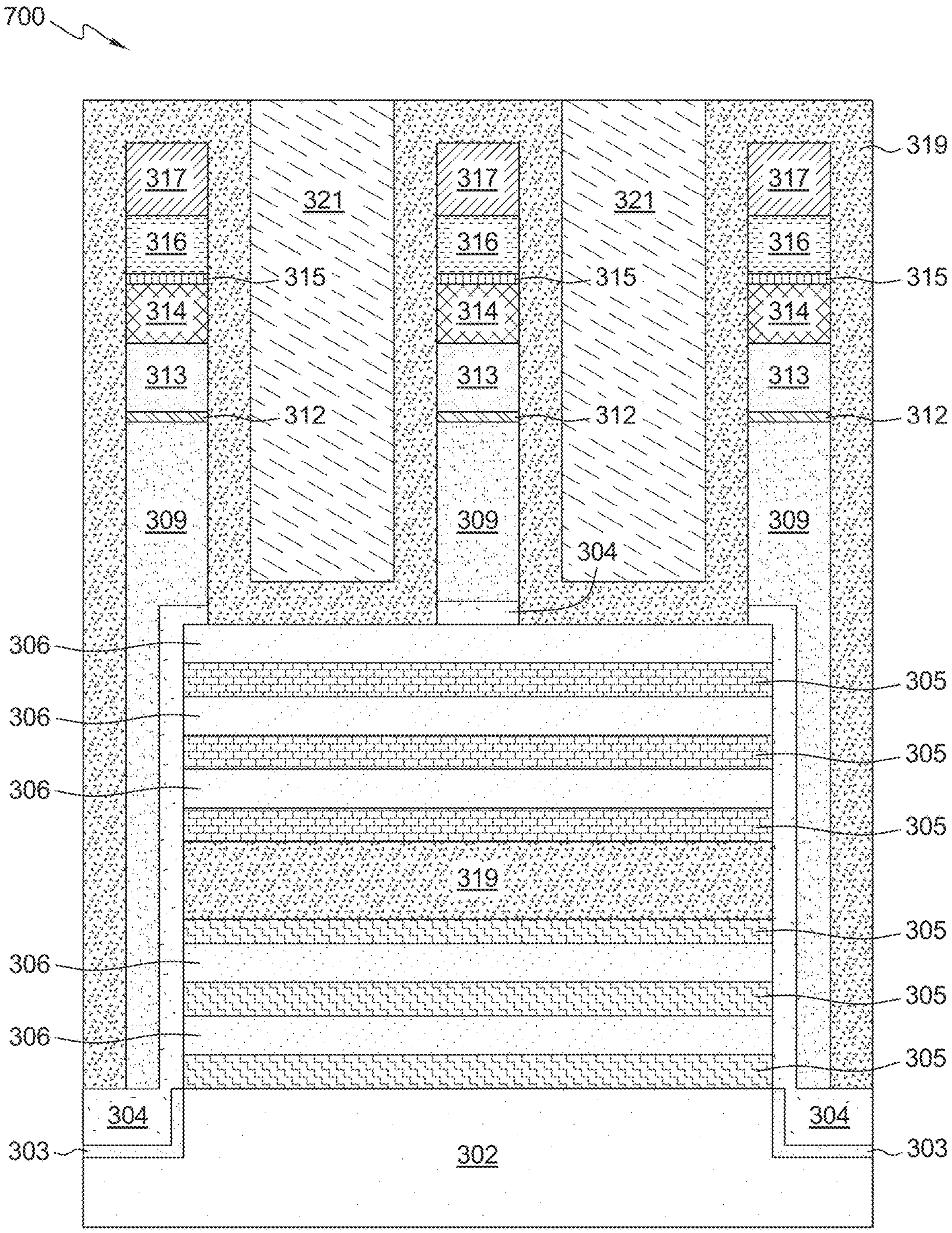
FIGS. 7A-7B depict various cross-sectional views of a fifth intermediate step of forming a stacked FET structure with dielectric isolation layers, according to some embodiments.
Figure 7B:
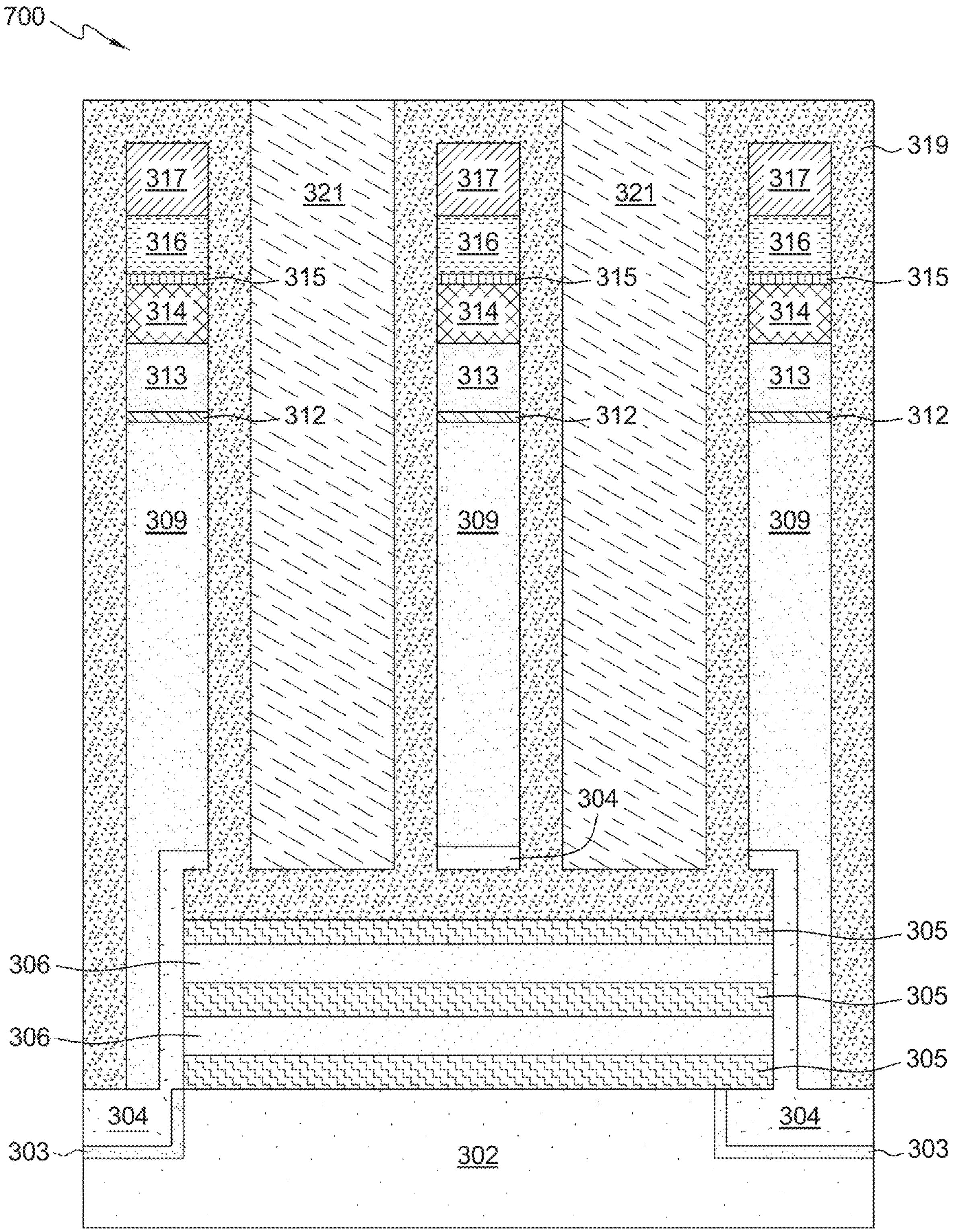

Referring to FIGS. 7A-7B, various cross-sectional views of an intermediate step 700 (also referred to herein as intermediate structure 700) of forming a stacked FET structure with crescent-shaped dielectric isolation layers are depicted, according to some embodiments. In some instances, intermediate step 700 includes removing HARP 322 and a portion of SOG 321 through a chemical mechanical planarization (CMP) smoothing/polishing step. This may result in a smooth/polished surface at the top surfaces of hardmask 319 and SOG 321.

Figure 8A:
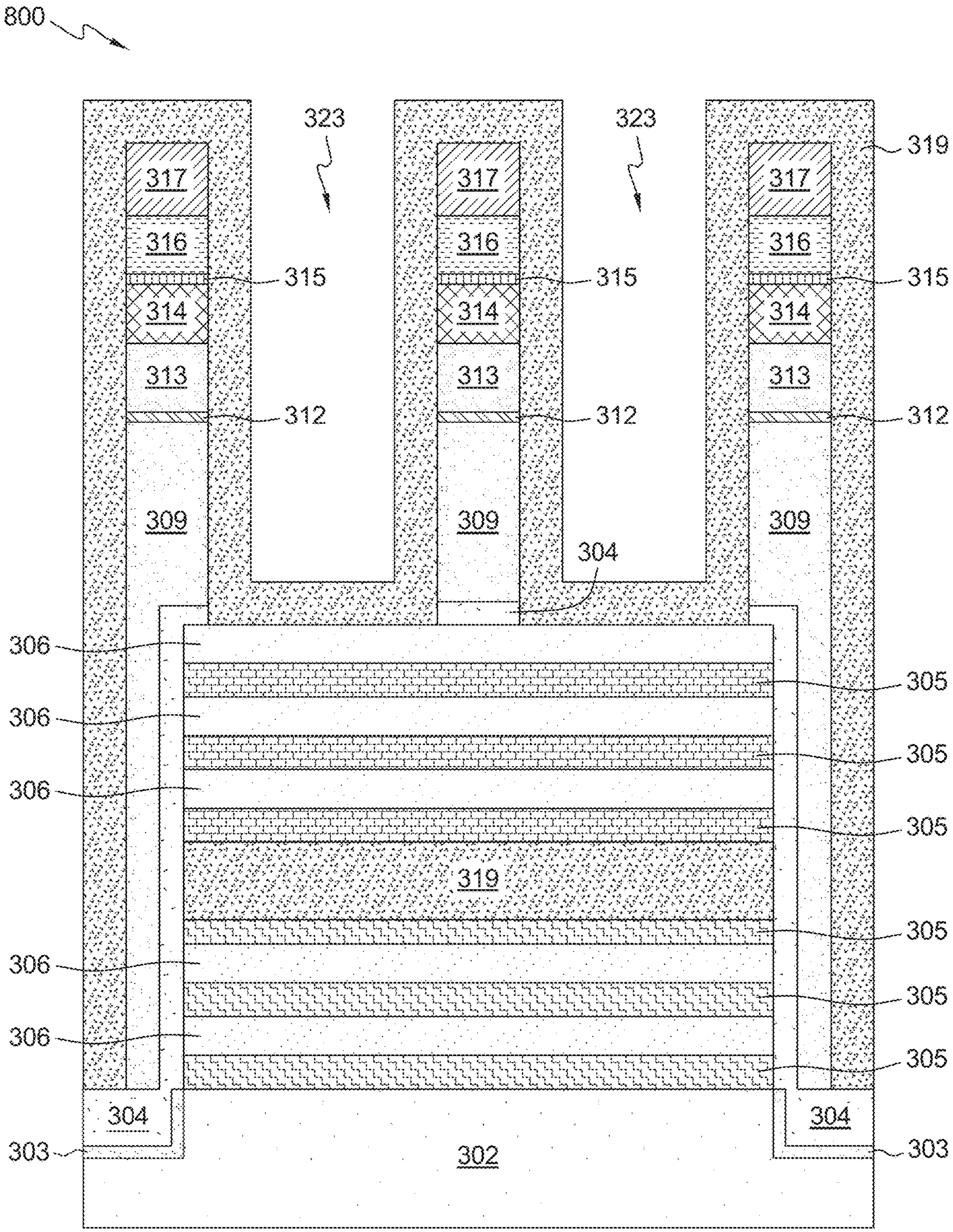
FIGS. 8A-8B depict various cross-sectional views of a sixth intermediate step of forming a stacked FET structure with dielectric isolation layers, according to some embodiments.
Figure 8B:
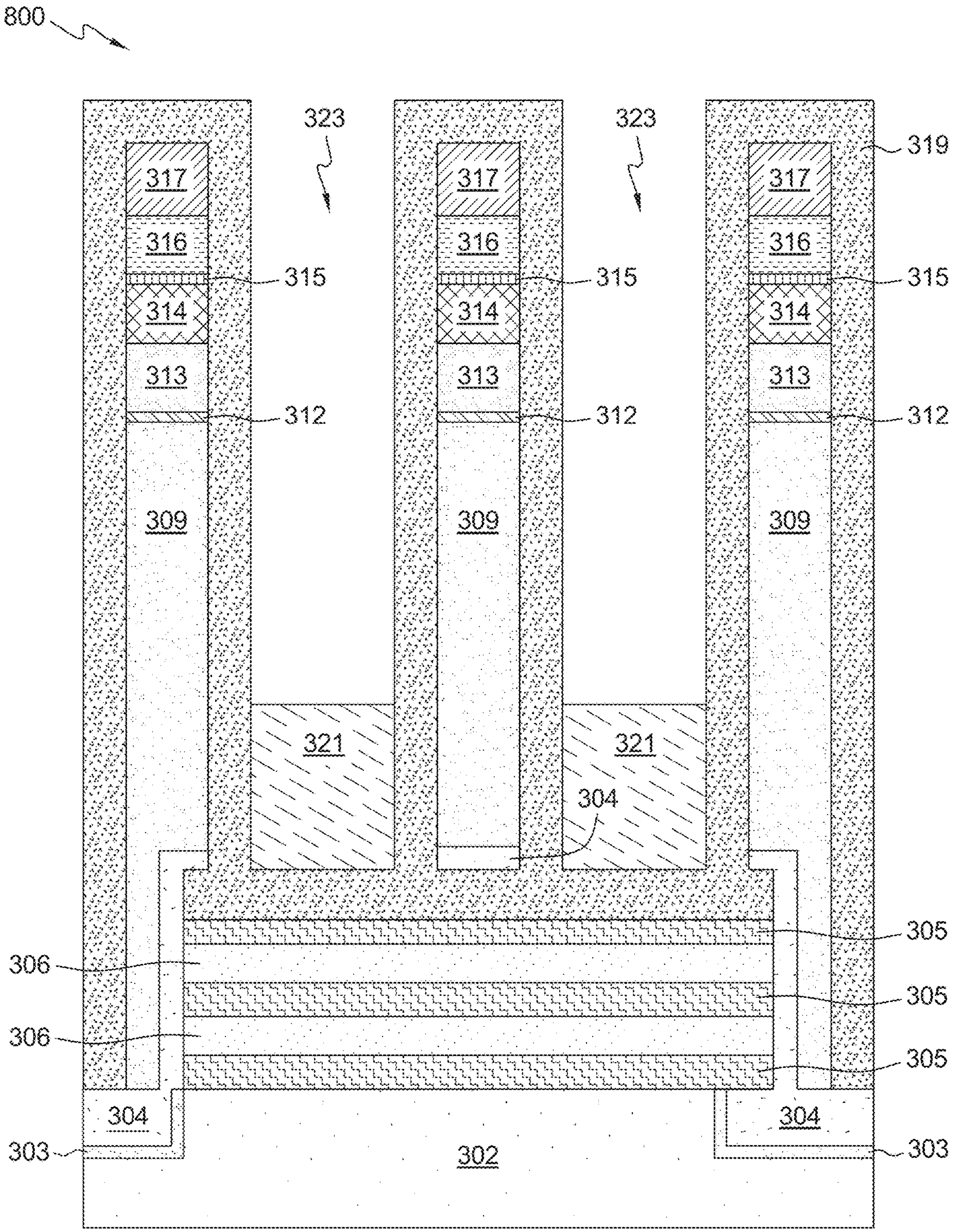

Referring to FIGS. 8A-8B, various cross-sectional views of an intermediate step 800 (also referred to herein as intermediate structure 800) of forming a stacked FET structure with crescent-shaped dielectric isolation layers are depicted, according to some embodiments. In some instances, intermediate step 800 includes removing a portion of SOG 321. The remaining portion of SOG 321 (depicted in FIG. 8B) may remain to help protect nanosheets 306 and dielectric 305 (which may become portions of bottom transistor(s) later in the formation process of the stacked FET structure) from any unwanted removal/etching. In some instances, the portion of SOG 321 that is removed may be removed using etching such as RIE, IBE, or any other patterning/etching process.

Figure 9A:
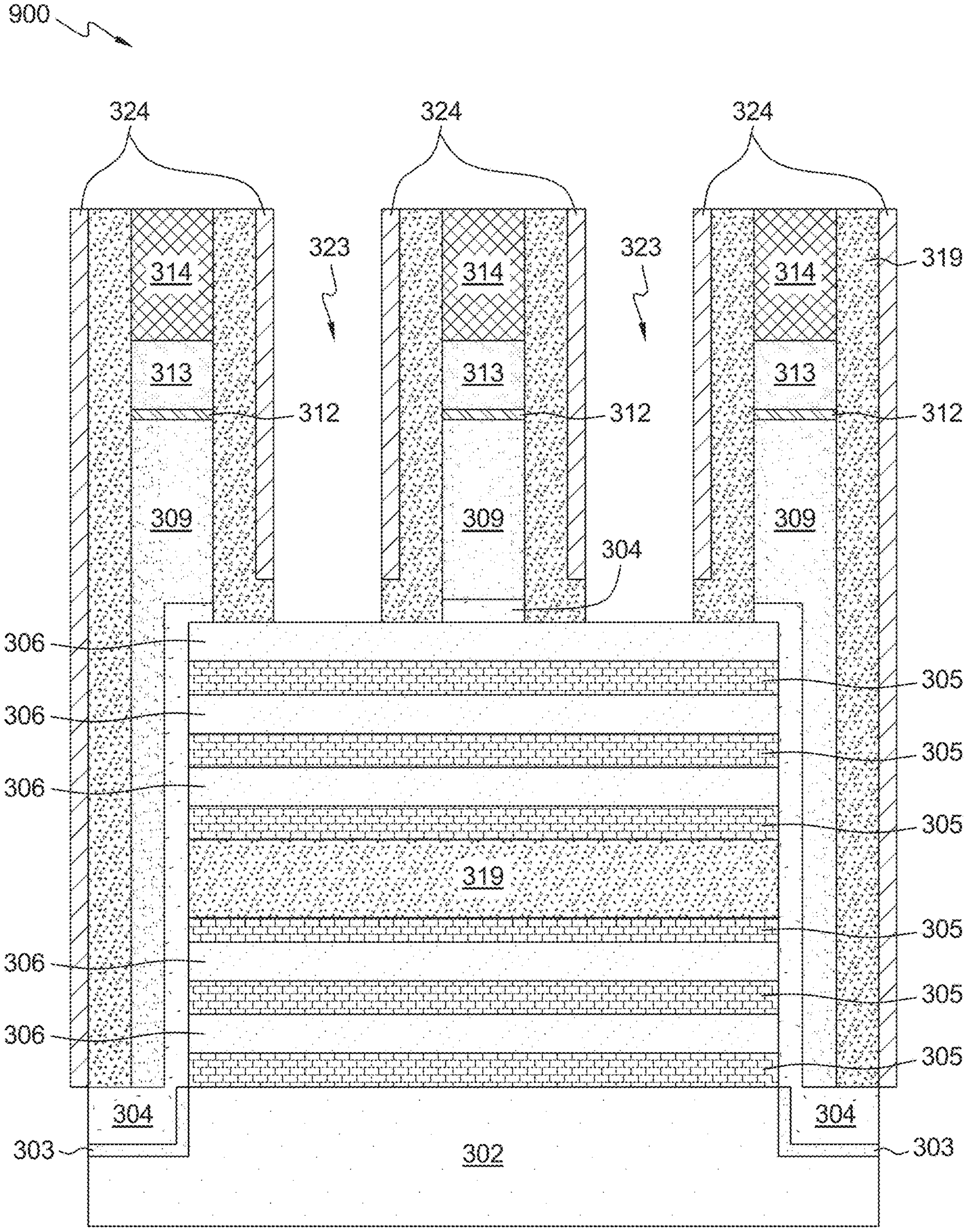
FIGS. 9A-9B depict various cross-sectional views of a seventh intermediate step of forming a stacked FET structure with dielectric isolation layers, according to some embodiments.
Figure 9B:
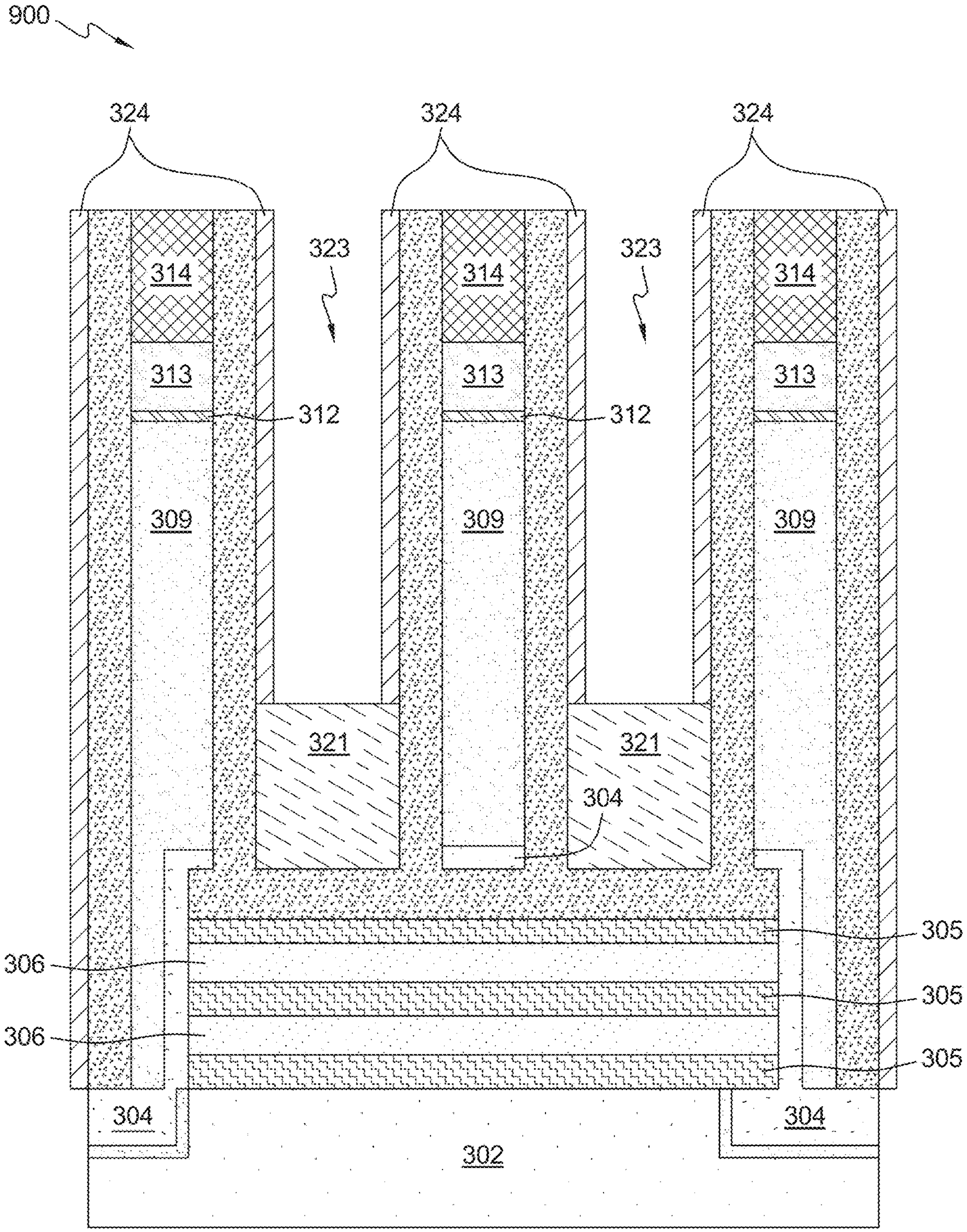

Referring to FIGS. 9A-9B, various cross-sectional views of an intermediate step 900 (also referred to herein as intermediate structure 900) of forming a stacked FET structure with crescent-shaped dielectric isolation layers are depicted, according to some embodiments. Intermediate step 900 may include depositing spacers 324 along exposed sidewalls of hardmask 319. Spacers 324 may be used to help properly space out the various components (and, in some instances, to also help protect the various components). In some instances, spacers 324 may be an oxide material. With the addition of spacers 324, openings 323 may occur between the spacers 324.

In some instances, as depicted in FIGS. 9A and 9B, intermediate step 900 may further include removing excess layers of dielectric (e.g., dielectric 315, 316, and 317) and excess portions of hardmask 319. Put differently, the materials above/on top of dielectric 314 may be removed (for example, through a CMP process).

Figure 10A:
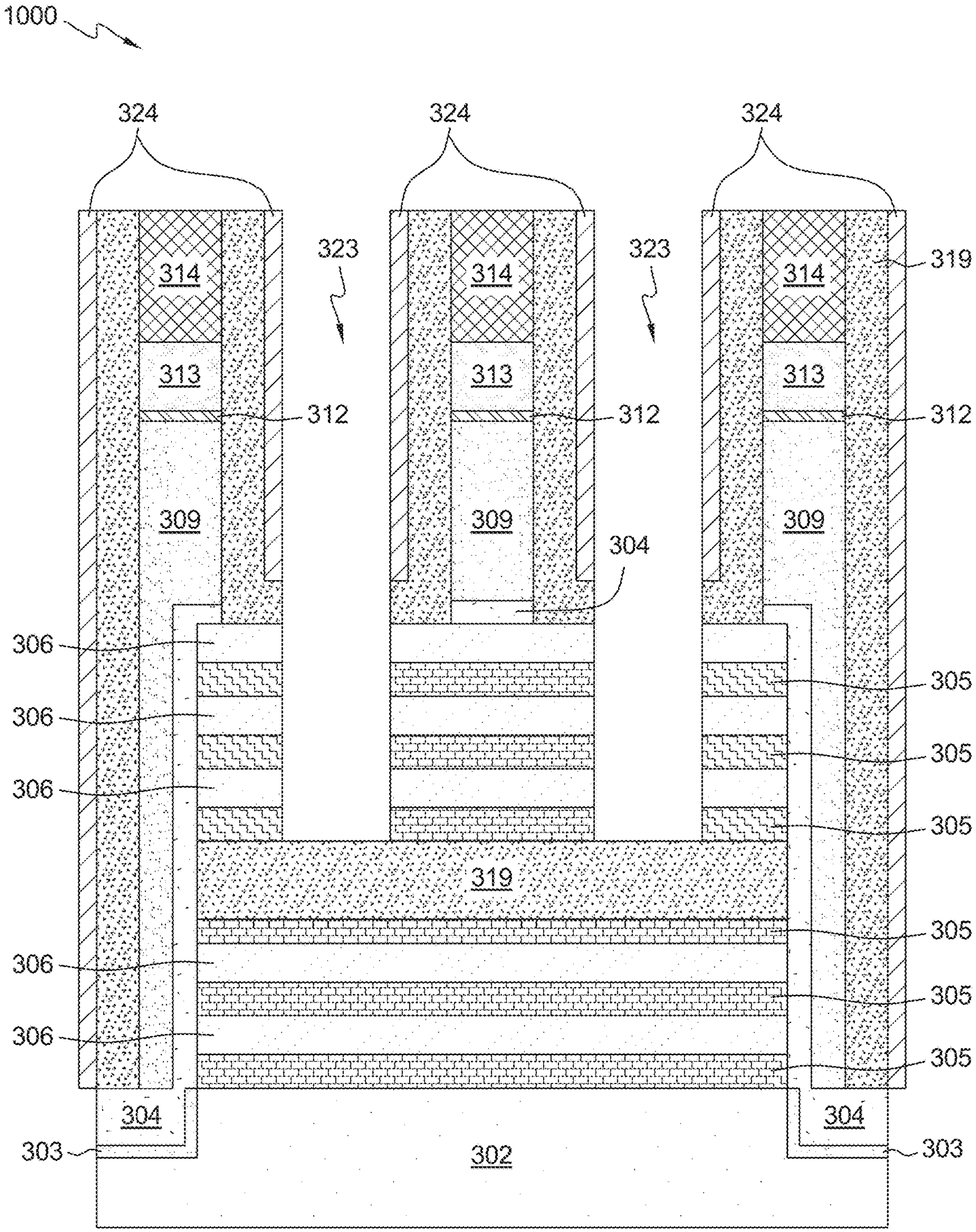
FIGS. 10A-10B depict various cross-sectional views of an eighth intermediate step of forming a stacked FET structure with dielectric isolation layers, according to some embodiments.
Figure 10B:
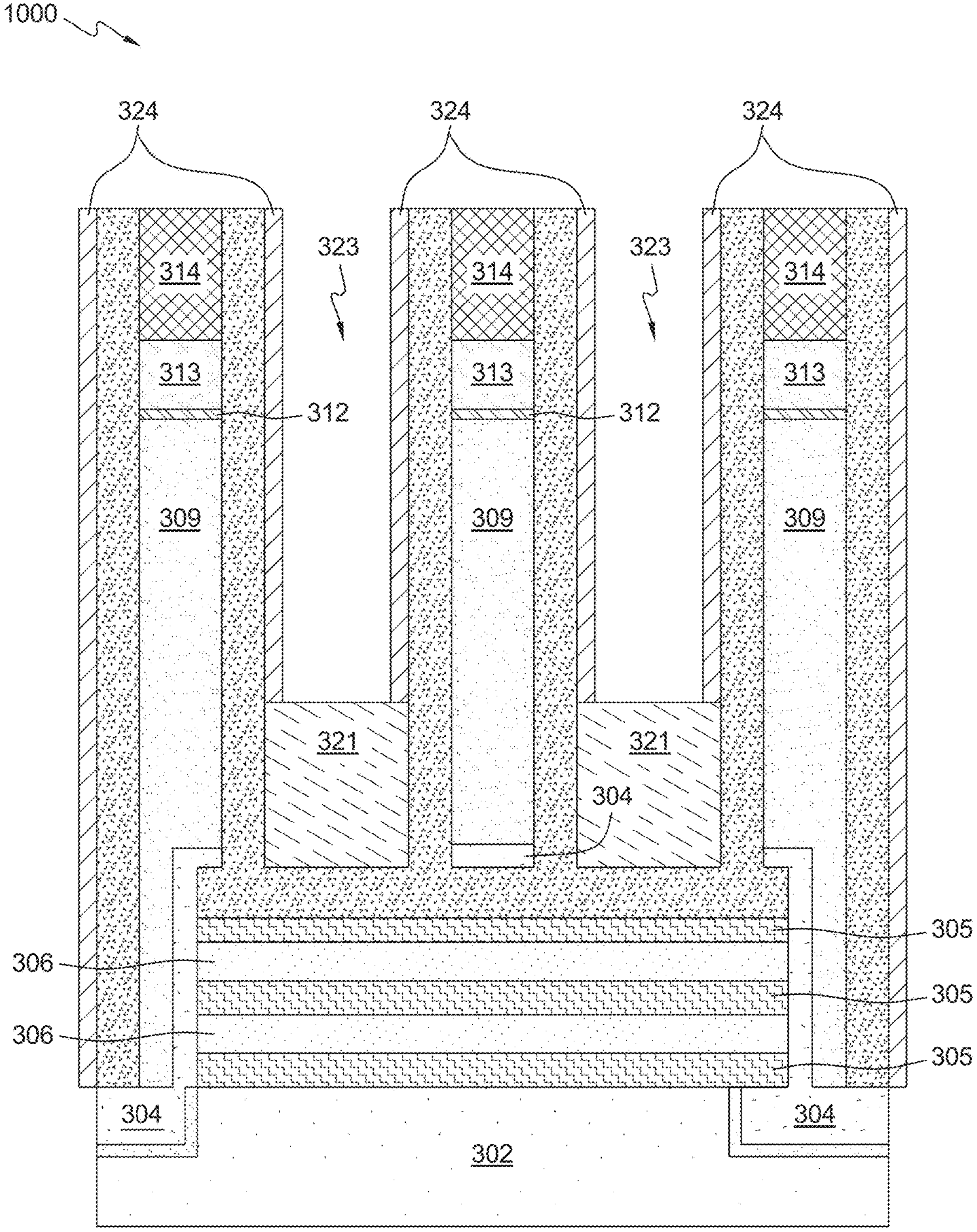

Referring to FIGS. 10A-10B, various cross-sectional views of an intermediate step 1000 (also referred to herein as intermediate structure 1000) of forming a stacked FET structure with crescent-shaped dielectric isolation layers are depicted, according to some embodiments. In intermediate step 1000, a top transistor recess may occur, where various materials are recessed/removed to continue the formation of the top transistor(s). In this instance, the recessing may include extending opening 323 up to hardmask 319 by recessing/removing portions of nanosheets 306 and dielectric 305. The recessing/removing may be executed using etching such as RIE, IBE, or any other patterning/etching process. The remaining SOG 321 (depicted in FIG. 9B) may help protect the bottom transistor(s) (i.e., nanosheets 306 and dielectric 305 that will become part of the bottom transistor(s)) from being removed during this recessing process.

Figure 11A:
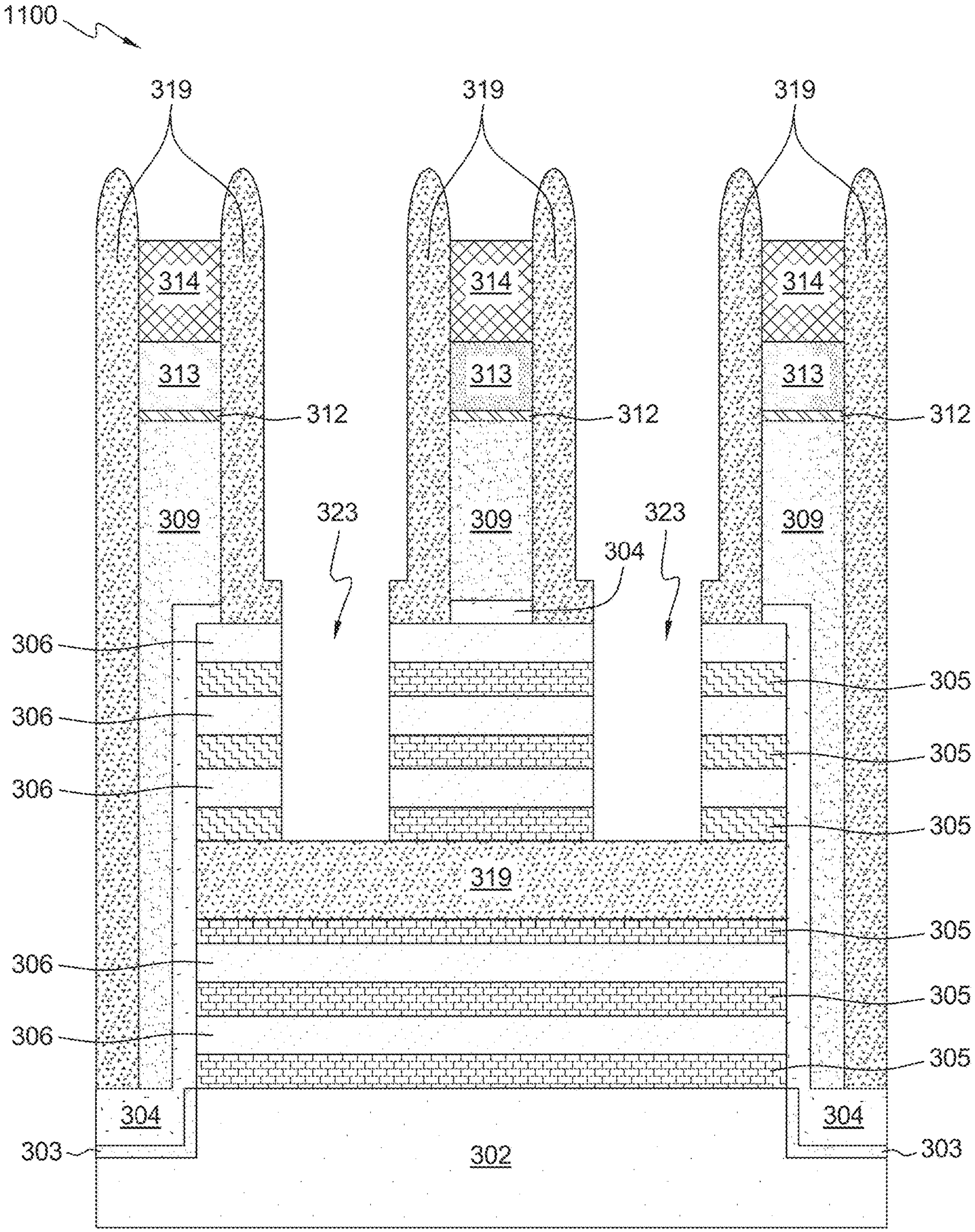
FIGS. 11A-11B depict various cross-sectional views of a ninth intermediate step of forming a stacked FET structure with dielectric isolation layers, according to some embodiments.
Figure 11B:
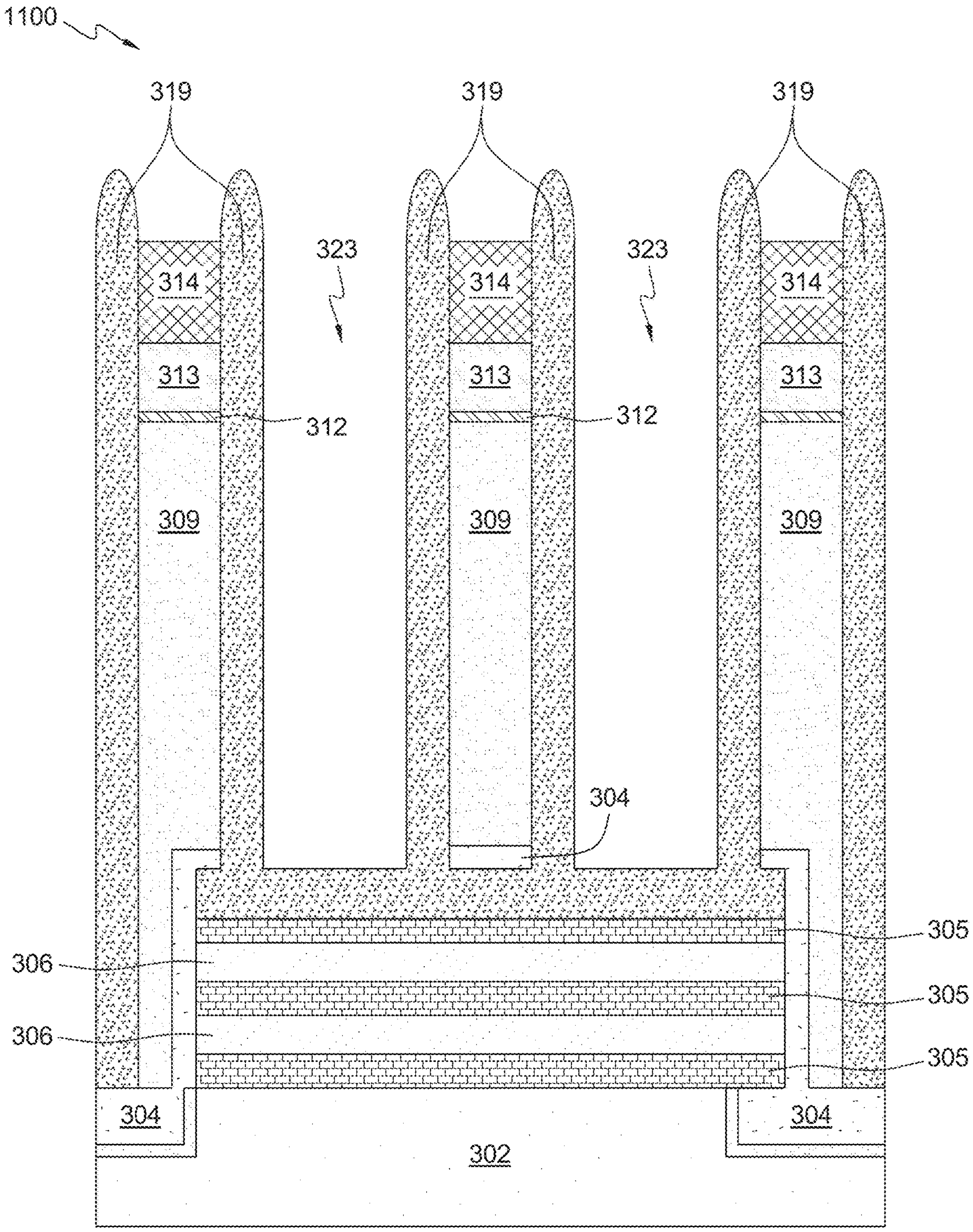

Referring to FIGS. 11A-11B, various cross-sectional views of an intermediate step 1100 (also referred to herein as intermediate structure 1100) of forming a stacked FET structure with crescent-shaped dielectric isolation layers are depicted, according to some embodiments. In intermediate step 1100, the remaining SOG 321 may be removed, as it is no longer needed to protect the bottom transistor(s). SOG 321 may be removed using etching such as RIE, IBE, or any other patterning/etching process. In some instances, intermediate step 1100 may also include removing spacers 324 (for example, using RIE, IBE, or any other patterning/etching process). In some instances, as depicted in FIGS. 11A and 11B, portions of hardmask 319 and dielectric 314 may also be removed/etched during the various removal processes.

Figure 12A:
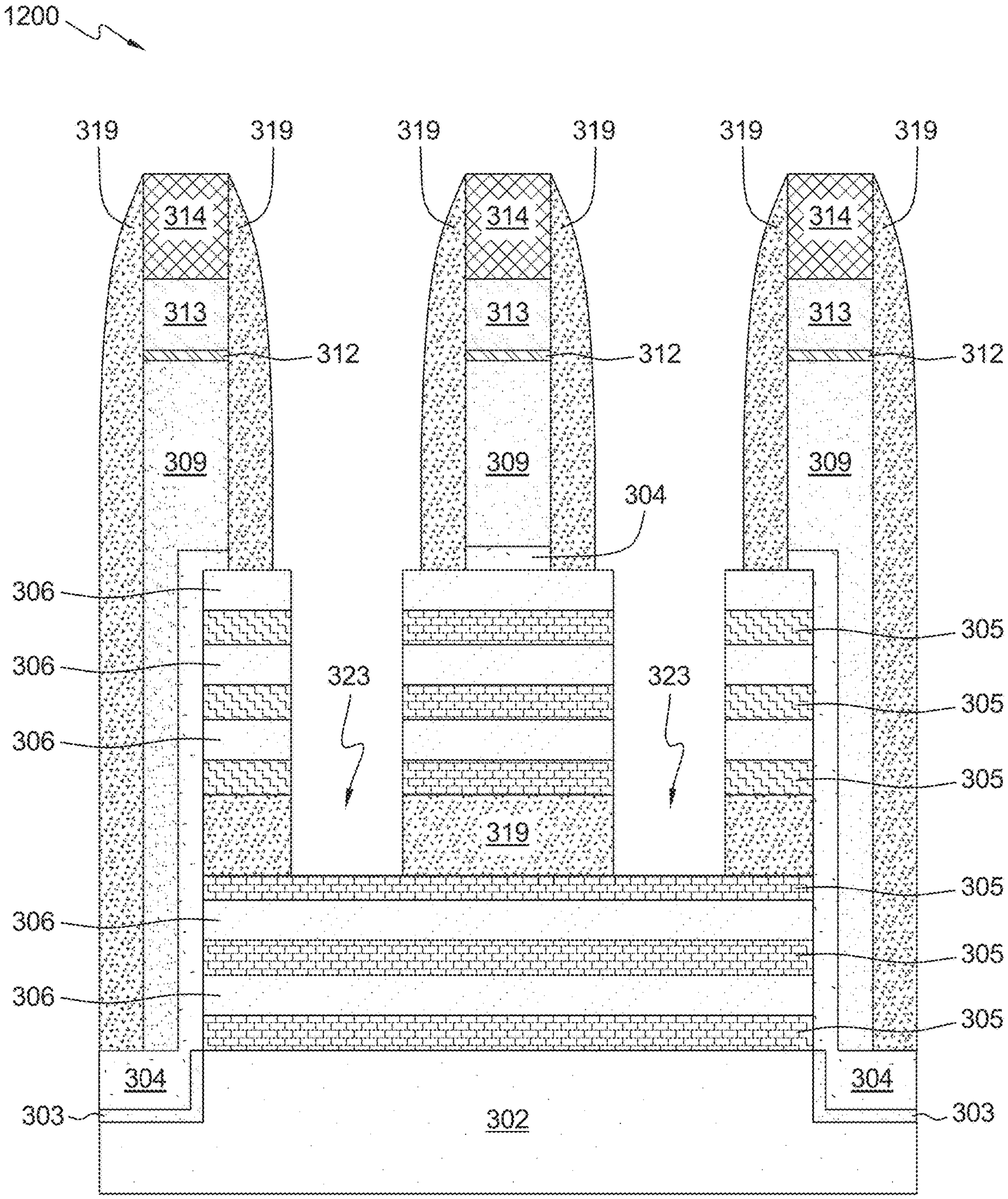
FIGS. 12A-12B depict various cross-sectional views of a tenth intermediate step of forming a stacked FET structure with dielectric isolation layers, according to some embodiments.
Figure 12B:
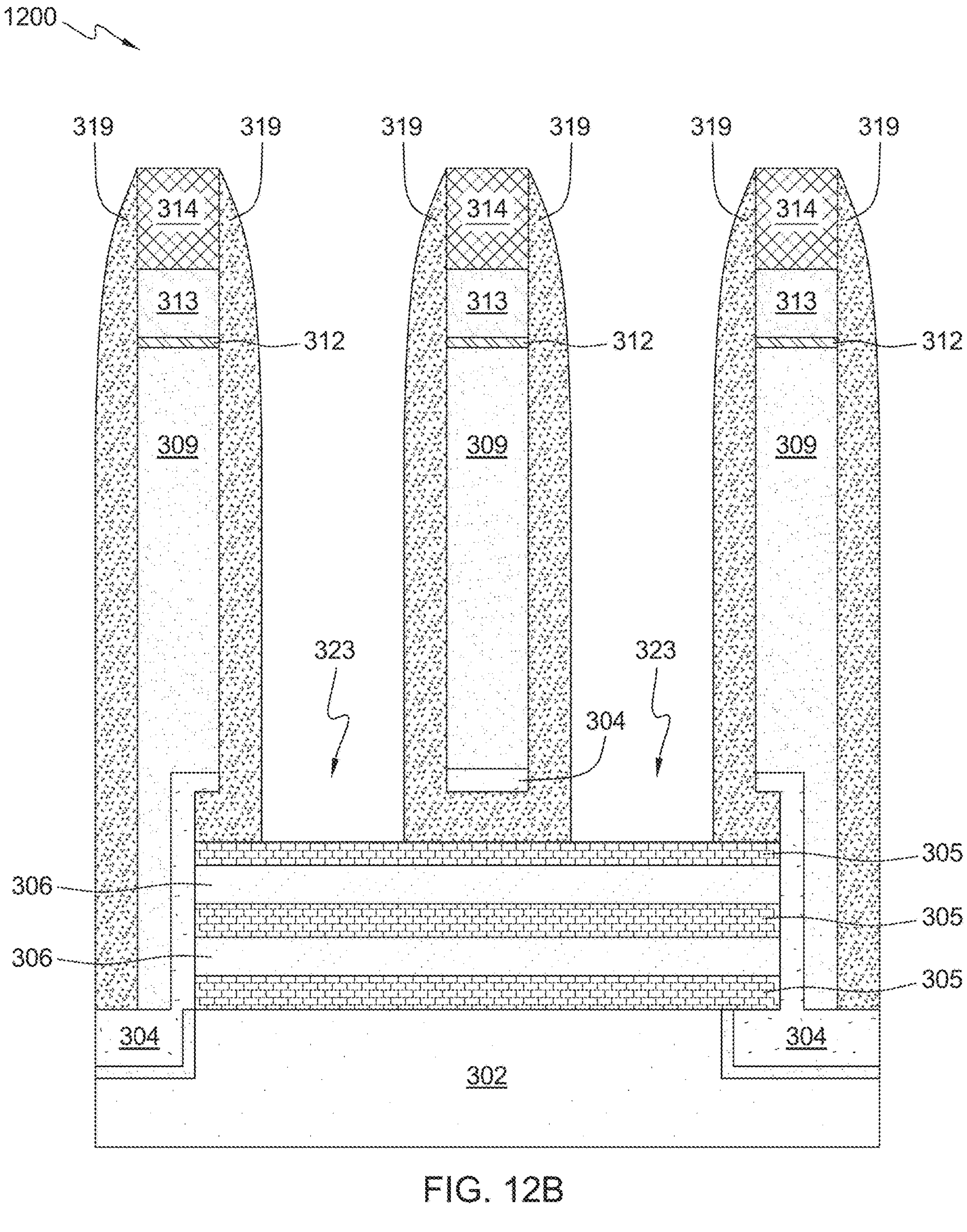

Referring to FIGS. 12A-12B, various cross-sectional views of an intermediate step 1200 (also referred to herein as intermediate structure 1200) of forming a stacked FET structure with crescent-shaped dielectric isolation layers are depicted, according to some embodiments. Intermediate step 1200 may include removing/recessing portions of hardmask 319 to extend opening 323 up to dielectric 305. In some instances, the recessed portions of hardmask 319 may be recessed/removed using etching such as RIE, IBE, or any other patterning/etching process. In some instances, as depicted in FIGS. 12A and 12B, portions of hardmask 319 (for instance, the portions near dielectric 314) may be further etched away. This may help prepare for further etching/patterning processes during the formation process of the stacked FET structure (e.g., stacked FET structure 1800 (FIGS. 18A and 18B) and/or stacked FET structure 100 (FIG. 1)).

Figure 13A:
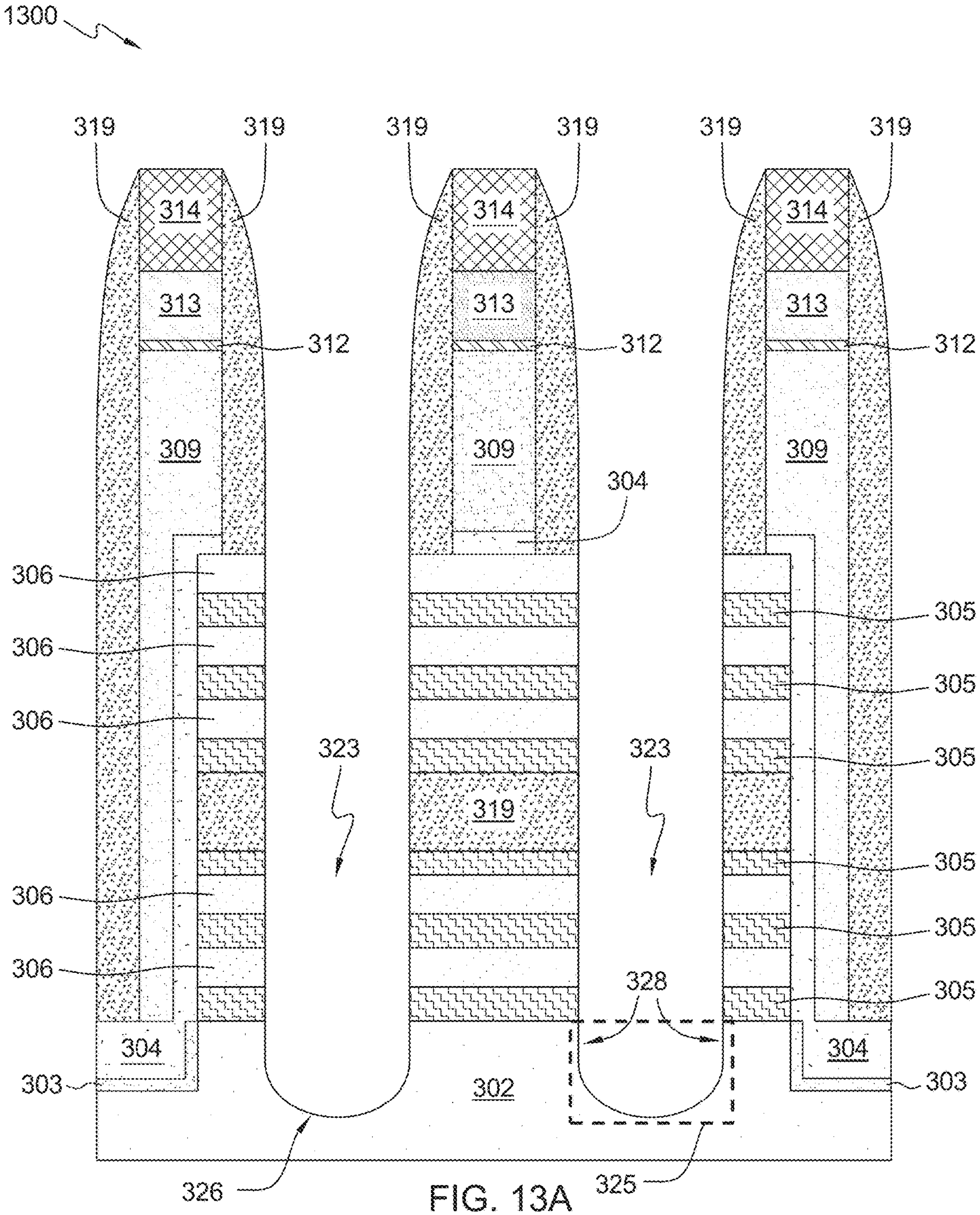
FIGS. 13A-13B depict various cross-sectional views of an eleventh intermediate step of forming a stacked FET structure with dielectric isolation layers, according to some embodiments.
Figure 13B:
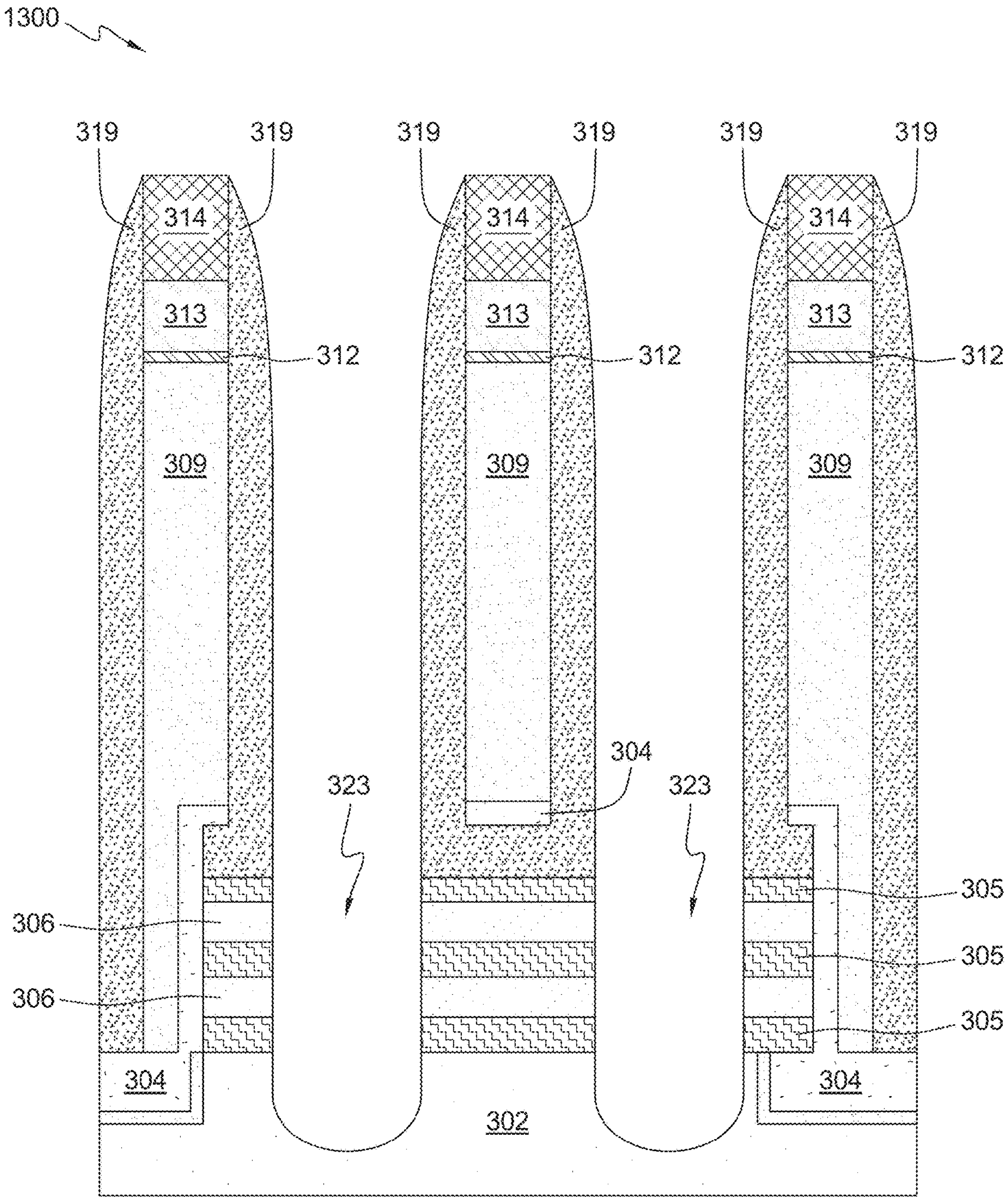

Referring to FIGS. 13A-13B, various cross-sectional views of an intermediate step 1300 (also referred to herein as intermediate structure 1300) of forming a stacked FET structure with crescent-shaped dielectric isolation layers are depicted, according to some embodiments. Intermediate step 1300 may include recessing/removing portions of the bottom transistor(s) (i.e., nanosheets 306 and dielectric 305) to extend openings 323 through a portion of substrate 302. In some instances, the removing/recessing may be done using etching such as RIE, IBE, or any other patterning/etching process.

In some instances, as depicted in FIGS. 13A and 13B, the recessing may be done in a curved shape 326. This curved shape may help in the formation of a crescent-shaped isolation layer (discussed further herein). In some instances, curved shape 326 is achieved through the type of etching process. For example, using a recessing RIE process, plasma/ions may get deflected from sidewalls of the opening(s) 323 and may etch the bottom of the openings 323 (which may become the curved shape 326). The etching may be controlled by keeping a certain over etch amount to gouge into the substrate 302 (for example, by over etching the substrate 302 by applying the etchant for a longer period of time), which may result in the curved shape 326 etched into the substrate 302.

In some instances, a portion of the opening 323 that extends into the substrate 302 may be referred to herein as a well 325. Specifically, as depicted in FIG. 13A, the well 325 is below the gate and channel components (for example, nanosheets 306 (i.e., channels) and/or dielectric 309 (which will later become metal/gates 335 as depicted in FIGS. 18A-18B)) and may be an opening/via in the substrate 302. The well 325 includes sidewalls 328 which, in some instances (as depicted in FIG. 13A), are vertical portion(s) of the well 325 (when viewing from the cross-section(s) depicted in FIGS. 1-18B). The well 325 also includes the curved shape 326.

Figure 14A:
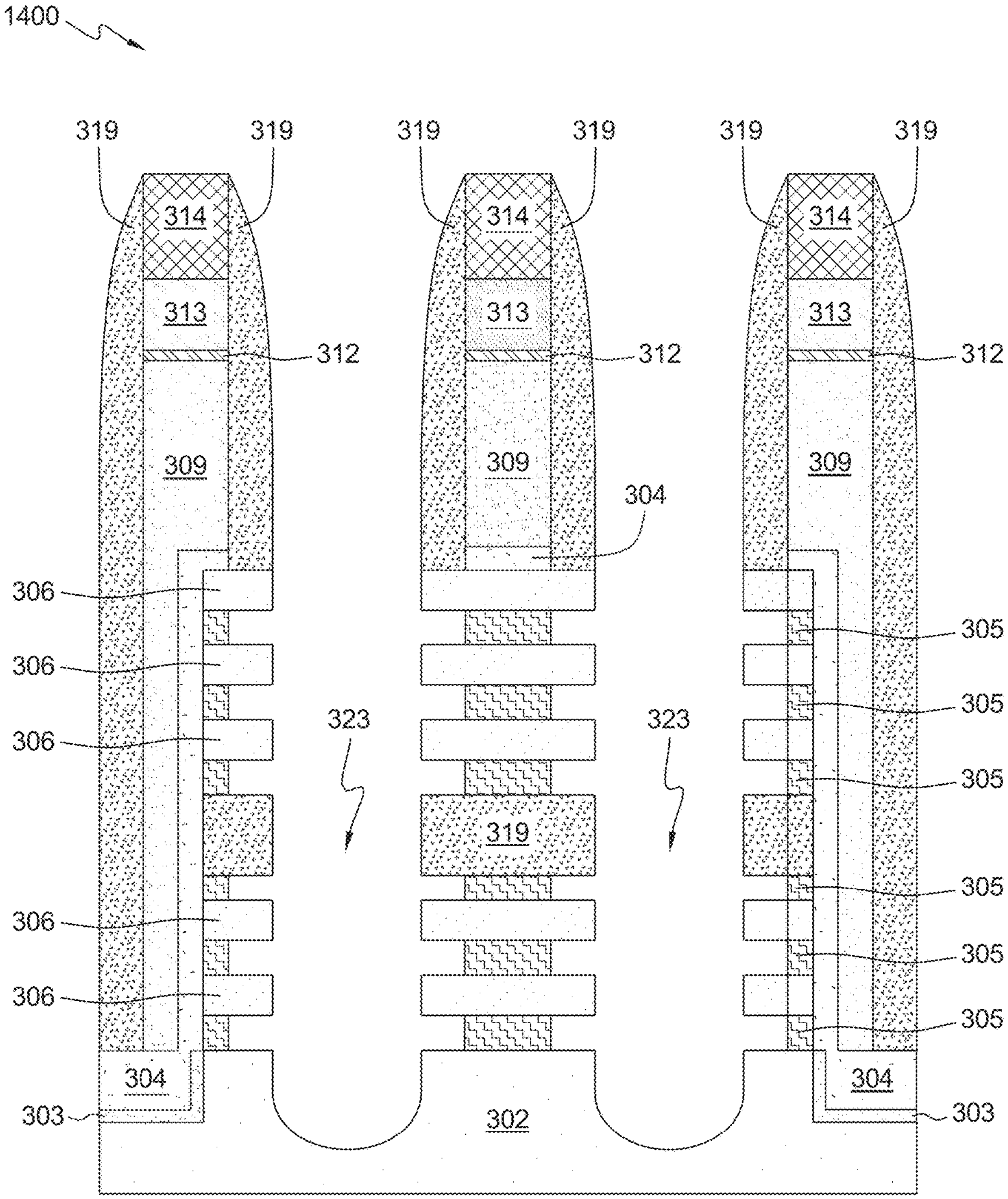
FIGS. 14A-14B depict various cross-sectional views of a twelfth intermediate step of forming a stacked FET structure with dielectric isolation layers, according to some embodiments.
Figure 14B:
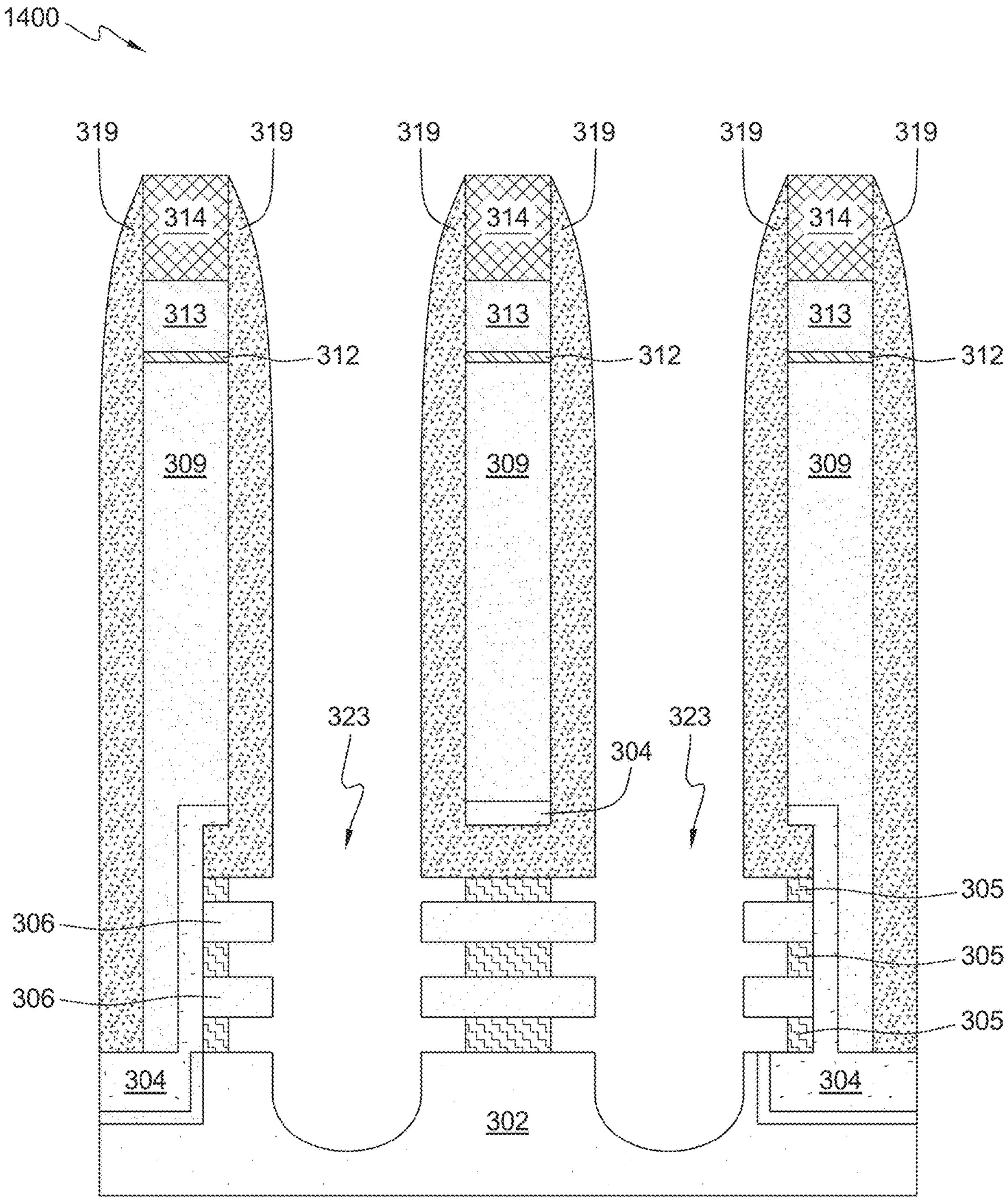

Referring to FIGS. 14A-14B, various cross-sectional views of an intermediate step 1400 (also referred to herein as intermediate structure 1400) of forming a stacked FET structure with crescent-shaped dielectric isolation layers are depicted, according to some embodiments. Intermediate step 1400 includes indenting dielectric 305, resulting in indented dielectric 305. This may help create the proper shape/structure for the dielectric 305 and the nanosheets 306 in their stacked FET structure. In some instances, the indenting process may be performed using a dry etch such as CVE, RIE, IBE, or any other patterning/etching process.

Figure 15A:
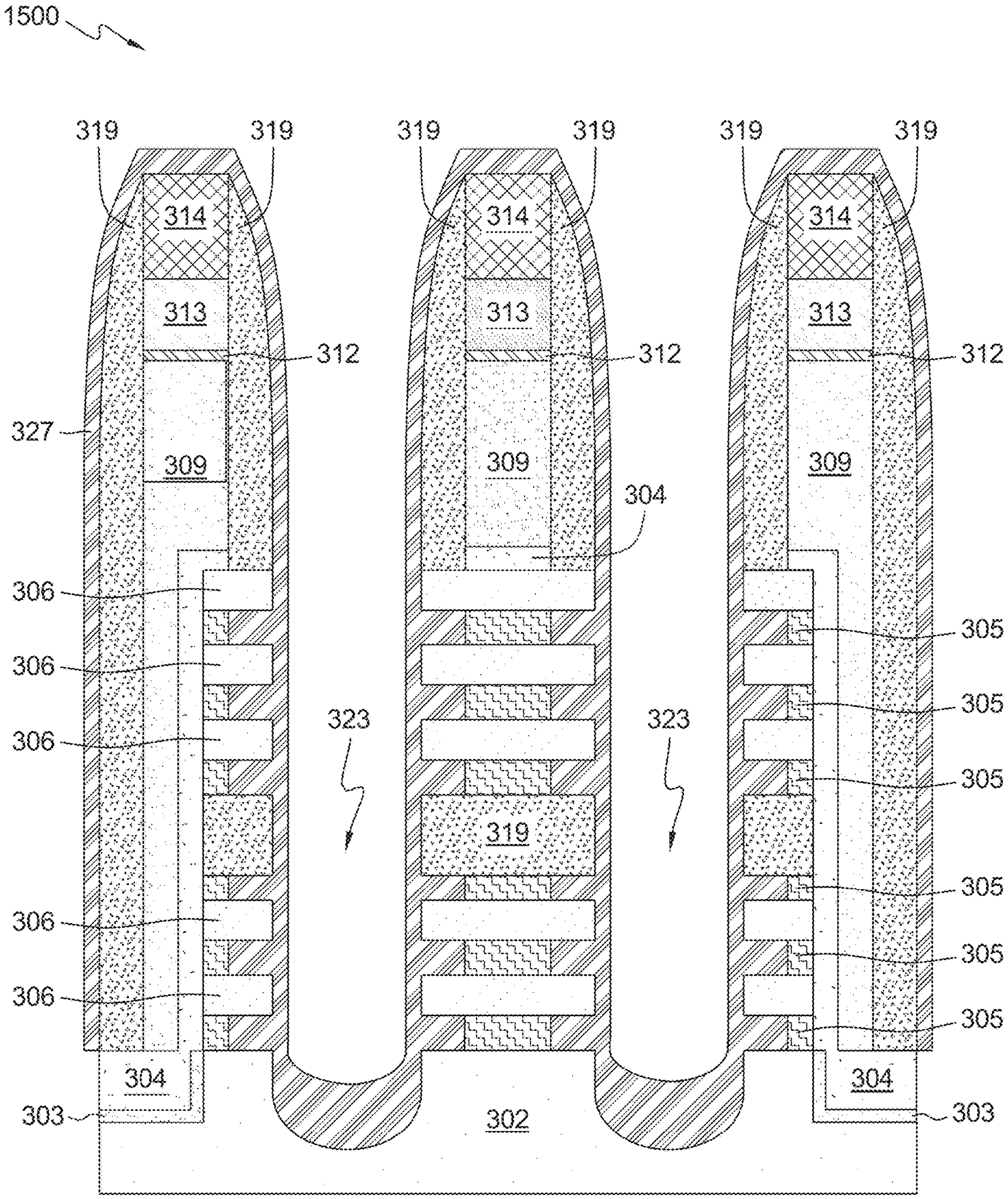
FIGS. 15A-15B depict various cross-sectional views of a thirteenth intermediate step of forming a stacked FET structure with dielectric isolation layers, according to some embodiments.
Figure 15B:
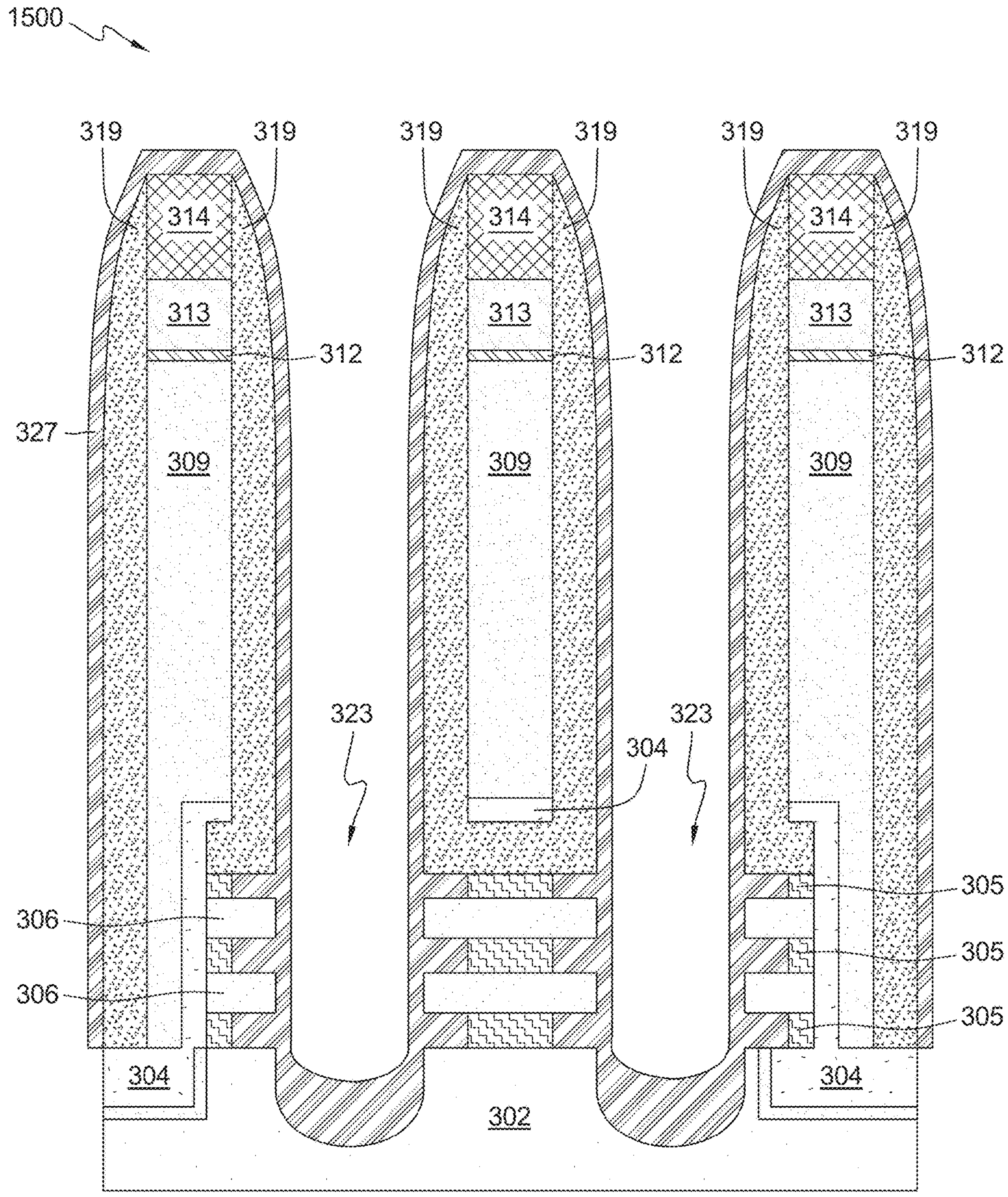

Referring to FIGS. 15A-15B, various cross-sectional views of an intermediate step 1500 (also referred to herein as intermediate structure 1500) of forming a stacked FET structure with crescent-shaped dielectric isolation layers are depicted, according to some embodiments. In some instances, intermediate step 1500 includes depositing dielectric 327 around various sidewalls of intermediate structure 1500 and within the curved well(s) in opening(s) 323 (for example, well 325 depicted in FIG. 13A). Dielectric 327 may be deposited using CVD, ALD, LCVD, and/or any other deposition technique. In some instances, dielectric 327 is a dielectric material such as SiN. Although dielectric 327 is depicted as having some straight edges/sidewalls after being deposited (for example, in opening 323), other shapes/curves may result from deposition in some instances. The deposition of dielectric 327 may be a conformal deposition process. Therefore, as depicted in FIGS. 15A-15B, the deposition may follow the profile of the opening(s) 323 and the dielectric 327 that is deposited at the bottom of the opening(s) 323 may follow the curved shape (for example, curved shape 326 in FIG. 13A). This may help form the top curve shape of the crescent-shaped dielectric isolation layer(s) (for example, isolation layer(s) 330 depicted in FIGS. 16A-16B).

Figure 16A:
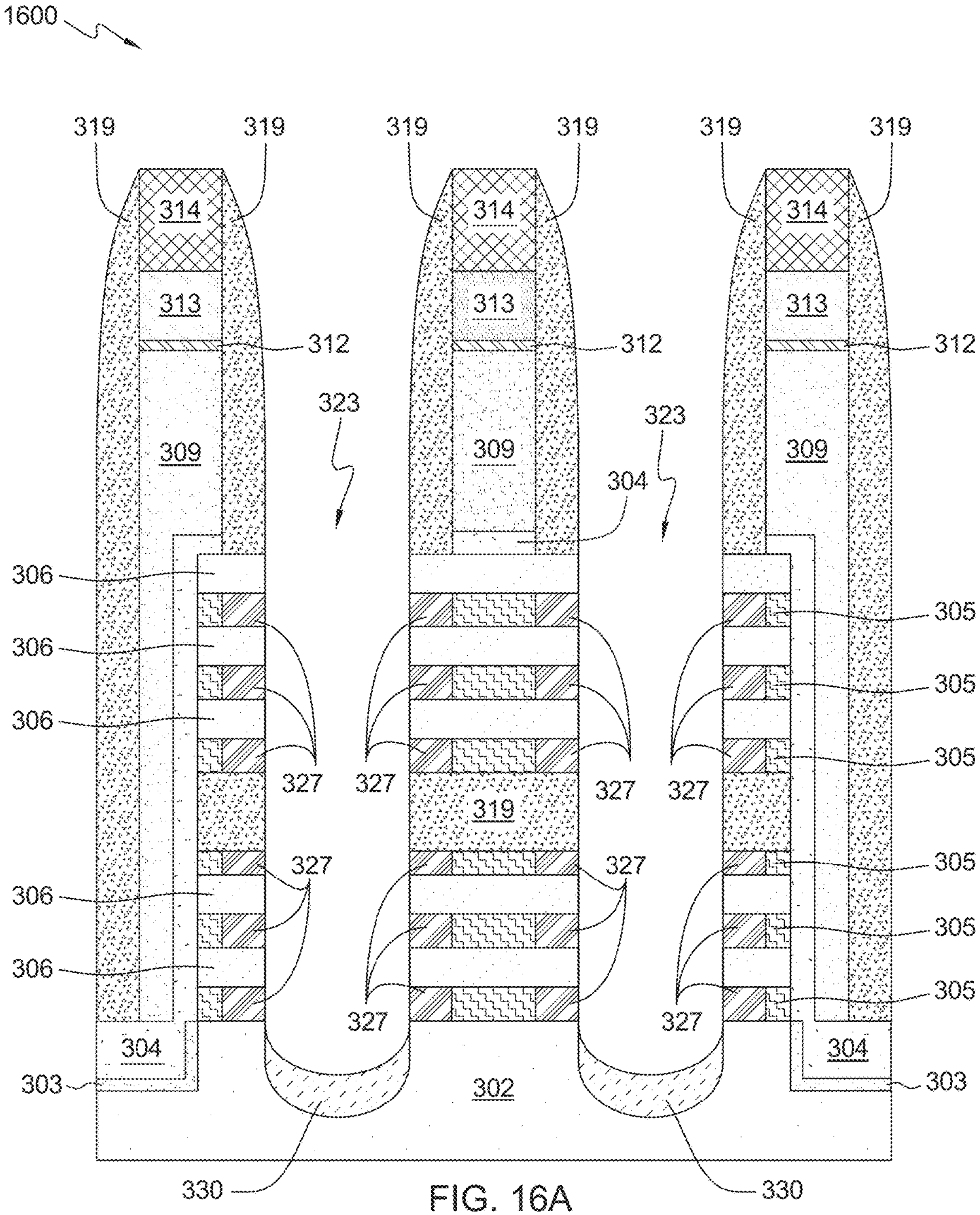
FIGS. 16A-16B depict various cross-sectional views of a fourteenth intermediate step of forming a stacked FET structure with dielectric isolation layers, according to some embodiments.
Figure 16B:
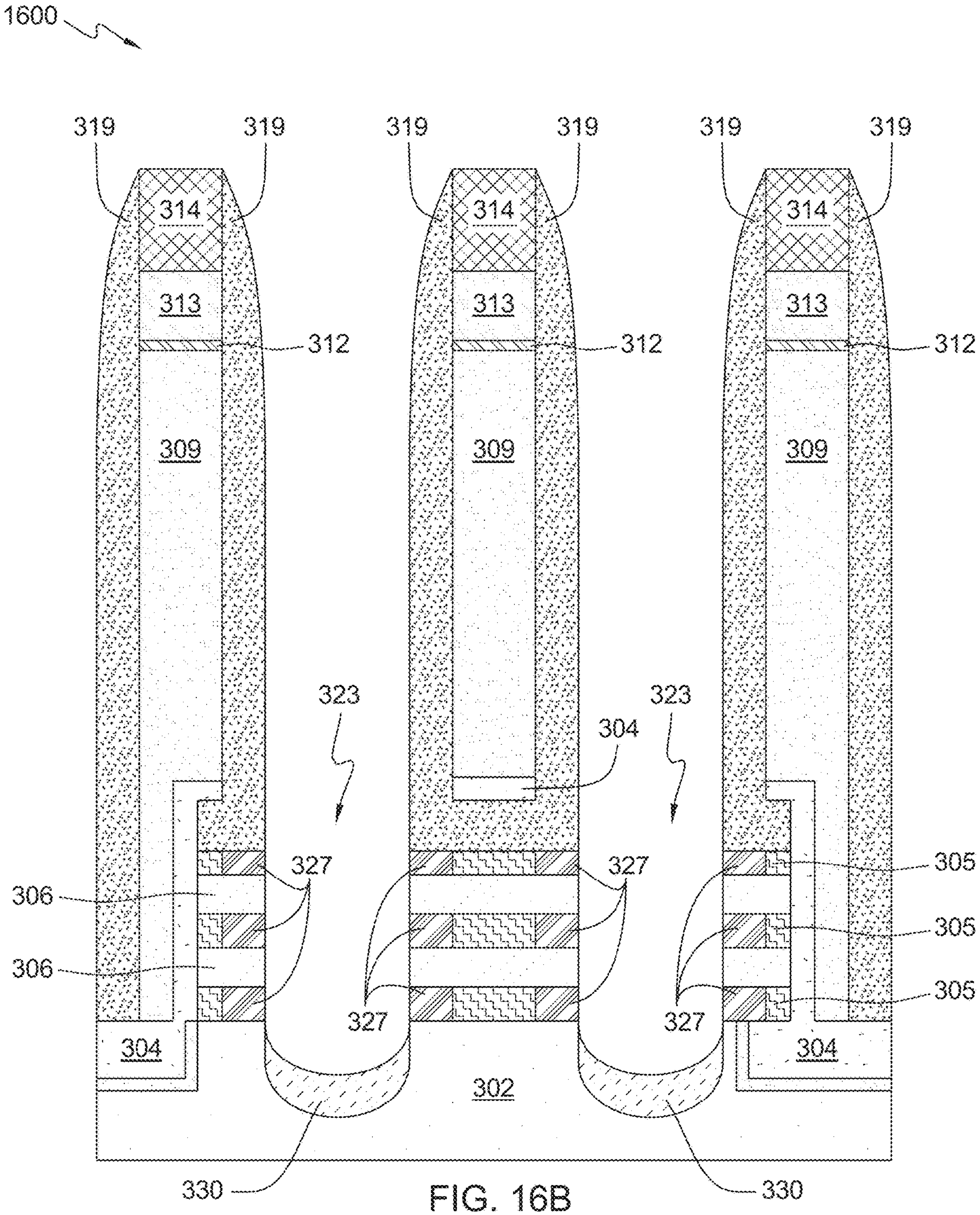

Referring to FIGS. 16A-16B, various cross-sectional views of an intermediate step 1600 (also referred to herein as intermediate structure 1600) of forming a stacked FET structure with crescent-shaped dielectric isolation layers are depicted, according to some embodiments. Intermediate step 1600 may include removing excess portions of dielectric 327 (for example, using a wet etch process). This may result in portions of dielectric 327 remaining in the openings left from the dielectric 305 indentation discussed herein in relation to intermediate step 1400 (and depicted in FIGS. 14A and 14B).

To help specify/clarify which portion of intermediate structure 1600 are the isolation layers 330, isolation layers 330 are depicted as a separate entity within intermediate structure 1600. However, in some instances, isolation layers 330 may be portions of dielectric 327 that were deposited in intermediate step 1500 (FIGS. 15A and 15B) and were not removed/etched away in intermediate step 1600 (FIGS. 16A and 16B). Therefore, in some instances, isolation layers 330 may be the same material as dielectric 327 (for example, SiN) and may be formed by removing excess dielectric 327 and shaping some of the remaining dielectric (depicted as isolation layers 330) into crescent shapes.

In some instances, as discussed herein and depicted in FIGS. 15A and 15B, a conformal deposition process may be used to deposit dielectric 327, and through the conformal process, may help shape/form the top curves of the crescent shape of isolation layers 330 depicted in FIGS. 16A and 16B. Therefore, the crescent shape may be primarily formed/shaped through the curved shape of the bottom of the openings 323 and the conformal deposition process for dielectric 327. Intermediate step 1600 may include removing excess dielectric 327, which may also finish forming isolation layers 330. For instance, a wet etching process may saturate at the bottom of the openings 323, which may result in slower etching at the bottom of the openings 323 (compared to the etching along the sidewalls of the openings 323, for example) which results in the isolation layer is at a bottom area of a well in the substrate.

As depicted in FIGS. 16A and 16B, dielectric 327 may be etched such that isolation layers 330 are not in contact with any other portions of dielectric 327. Instead, as depicted, there may be a small opening above isolation layers 330 where substrate 302 is in direct contact with openings 323. Put differently, there may be a small part of the curved portion of the substrate that is not in direct contact with the isolation layers 330. This may allow for partial exposure between bottom epi(s) and substrate 302 when bottom epi(s) are grown (discussed herein).

Figure 17A:
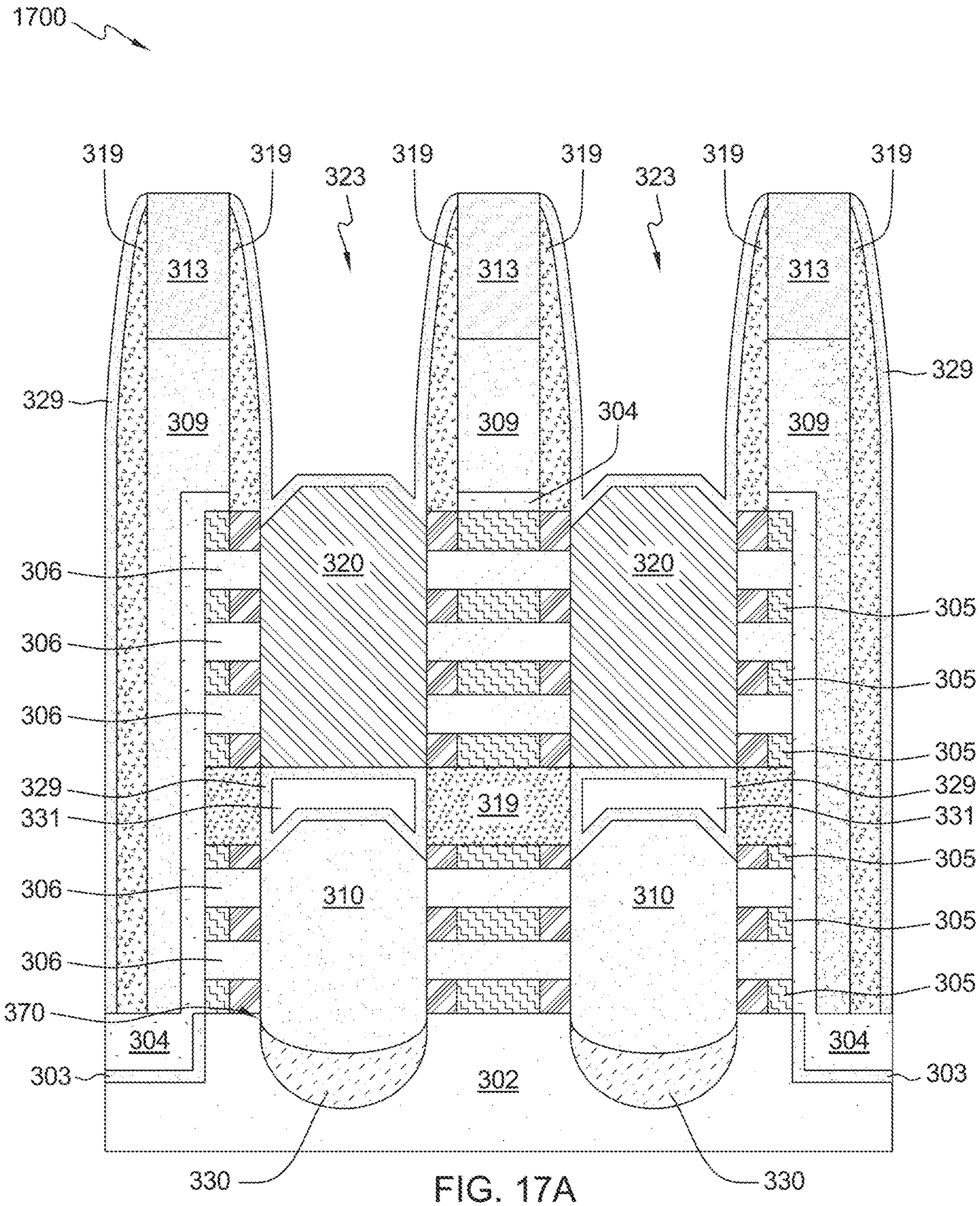
FIGS. 17A-17B depict various cross-sectional views of a fifteenth intermediate step of forming a stacked FET structure with dielectric isolation layers, according to some embodiments.
Figure 17B:
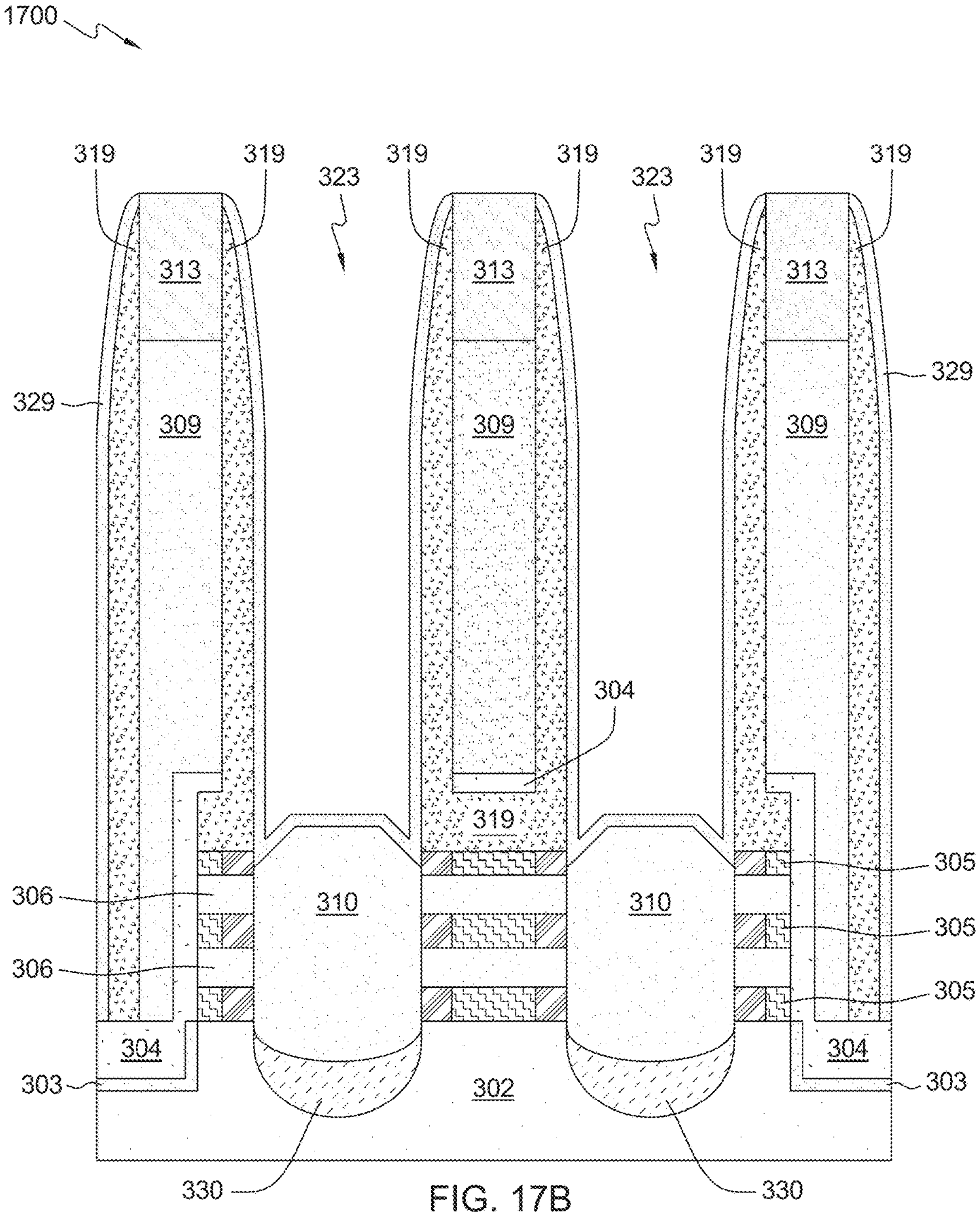
Figure 18A:
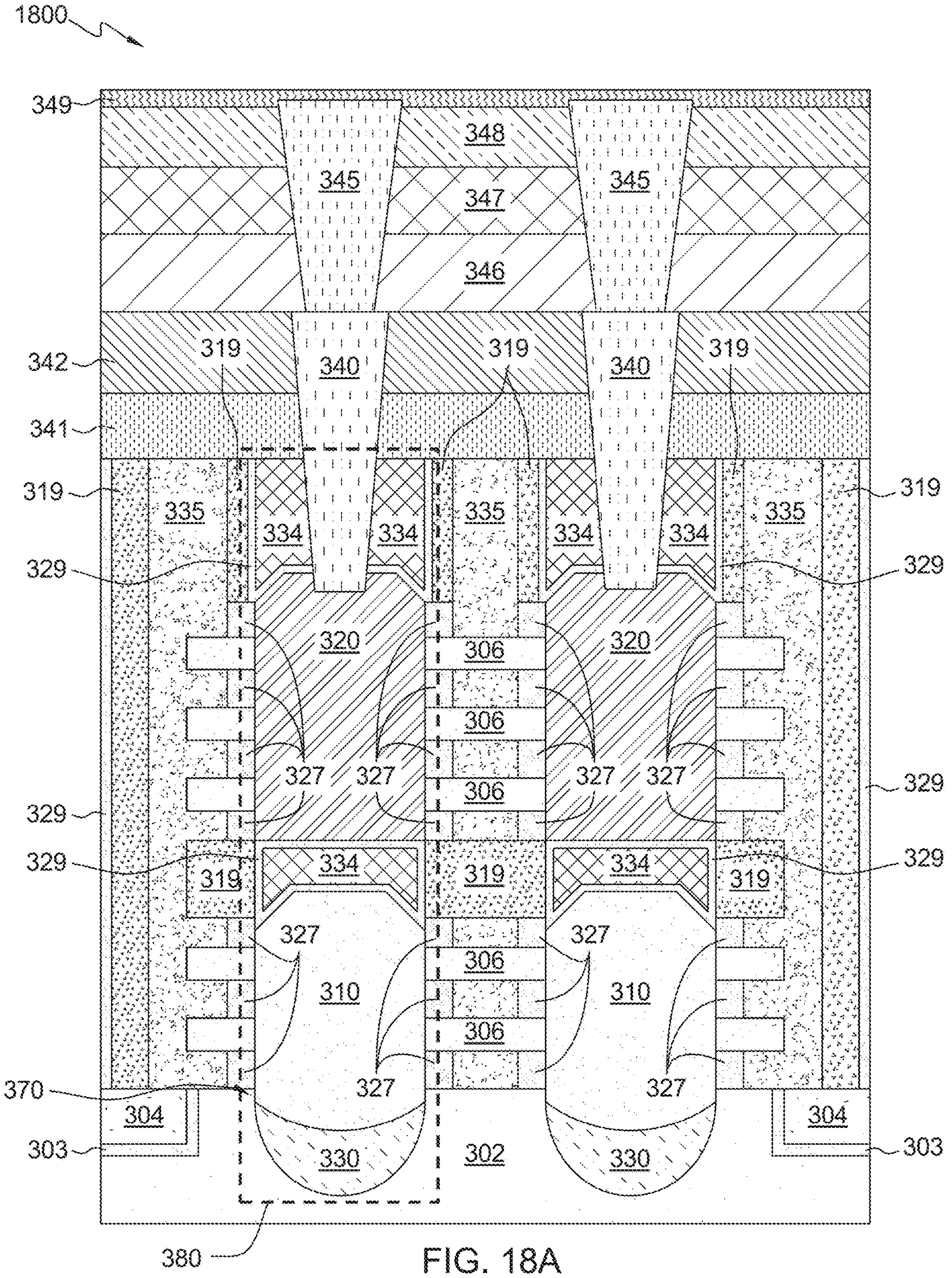
FIGS. 18A-18B depict various cross-sectional views of a fully formed stacked FET structure with dielectric isolation layers, according to some embodiments.
Figure 18B:
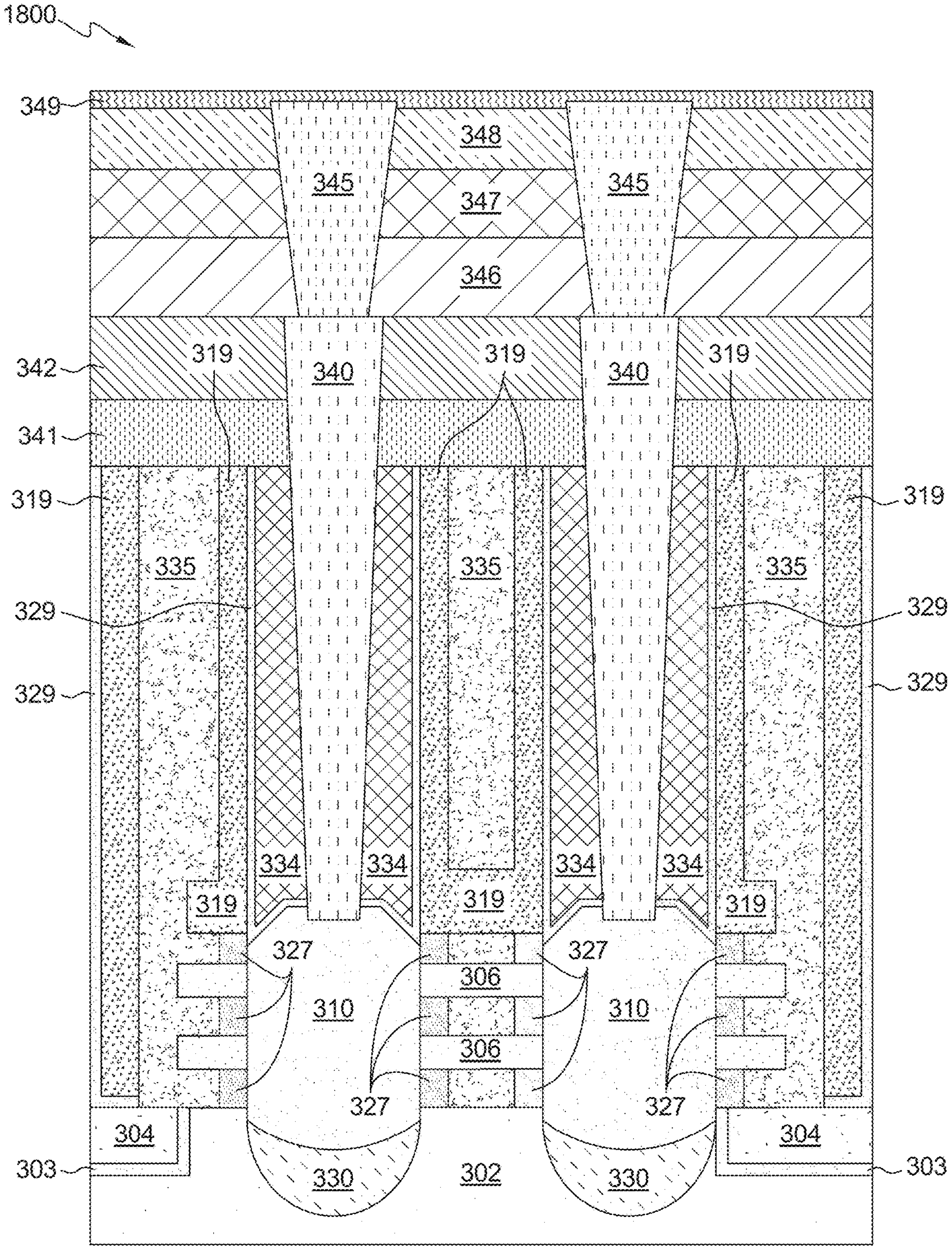

Referring to FIGS. 17A-17B, various cross-sectional views of an intermediate step 1700 (also referred to herein as intermediate structure 1700) of forming a stacked FET structure with crescent-shaped dielectric isolation layers are depicted, according to some embodiments. In intermediate step 1700, the top and bottom epis (320 and 310, respectively) may be grown/formed and a liner 329 may be deposited. In some instances, the liner 329 may be a poly-open CMP (POC) liner 329. POC liner 329 may be a SiN material, in some instances. In some instances, the liner 329 may be deposited using a conformal deposition process, so it is able to be deposited on all the desired areas of the intermediate structure 1700. This may result in an opening 331 where POC liner 329 is not deposited.

Growing epis, as referred to herein, may be the process of forming epis (i.e., top epis 320 and bottom epis 310). In some instances, the top and bottom epis (320 and 310, respectively) may be grown through CVD, vapor-phase epitaxy (VPE), and/or any other epi growth technique. As depicted in FIGS. 17A and 17B, the bottom epis 310 are connected to the substrate 302 at the sidewalls of the well (for example, one such area of connection is depicted as exposed area 370). In some instances, a portion of the bottom epi(s) 310 that is directly connected to the isolation layer(s) 330 is greater than a portion of the bottom epi(s) 310 directly connected to the substrate 302. As discussed herein, these exposed areas/portions may result in better quality epi growth/better quality bottom epis 310, as the bottom epis 310 may have room to grow from both nanosheets 306 and from substrate 302, as opposed to having to grow from just the nanosheets 306.

In some instances, bottom epis 310 and top epis 320 may be materials such as SiGe, Si, SiC, etc. In some instances, bottom epis 310 and top epis 320 may be different materials. For instance, the epi materials may correspond to a type of transistor (e.g., NFET or PFET). In some instances, PFETs may include epi materials such as boron-doped or gallium-doped SiGe, and NFETs may include epi materials such as phosphorous-doped or arsenic-doped Si or SiC. Therefore, for example, when the bottom transistors (corresponding to bottom epis 310) are PFETs and the top transistors (corresponding to top epis 320) are NFETs, bottom epis 310 may be boron- or gallium-doped SiGe and top epis 320 may be phosphorous- or arsenic-doped Si or SiC. In another example, when the bottom transistors are NFETs and the top transistors are PFETs, bottom epis 310 may be phosphorous- or arsenic-doped Si or SiC and top epis 320 may be boron- or gallium-doped SiGe.

Referring to FIGS. 18A-18B, various cross-sectional views of a fully formed stacked FET structure 1800 with crescent-shaped dielectric isolation layers are depicted, according to some embodiments. Stacked FET structure 1800 may also be referred to as semiconductor structure 1800. For brevity sake, the specific techniques used to finish forming stacked FET structure 1800 from intermediate structure 1700 (FIGS. 17A and 17B) are not discussed herein. However, any technique(s) may be used herein.

Fully formed stacked FET structure 1800 may include dielectric 334, metals 335, contacts 340 and 345, and dielectric layers 341, 342, 346, 347, 348, and 349. In some instances, dielectric 334, metals 335, contact 340, and dielectric layers 341 and 342 may correspond to dielectric 134, metals 135, contact 140, and dielectric layers 141 and 142, respectively, from stacked FET structure 100 (FIG. 1). In addition, stacked FET structure 1800 may include contacts 345 and dielectric layers 346, 347, 348, and 349, as depicted in FIGS. 18A and 18B. In some instances, contacts 345 may help connect contacts 340 to other components of the semiconductor/device (not depicted). In some instances, contacts 345 may be metal materials such as Co, W, etc. Dielectric layers 346, 347, 348, and 349 may help protect contacts 345 and prevent any unwanted heat and/or current transfer. In some instances, dielectric layers 346, 347, 348, and 349 may be same/similar materials. In some instances, dielectric layers 346, 347, 348, and 349 may be different materials. For example, dielectric layer 346 may be SiNO, dielectric layer 347 may be an oxide material, dielectric layer 348 may be SiN, and dielectric 349 may be an oxide material and/or SiNO.

In some instances, although FIGS. 18A and 18B depict two sets of contacts (contacts 340 and 345) and six layers of dielectric (341, 342, 346, 347, 348, and 349), any number of contacts and dielectric layers may be used here.

Stacked FET structure 1800 includes dielectric isolation layers 330 that create a partial connection and partial isolation between bottom epis 310 and substrate 302. As discussed herein (for example, in relation to intermediate structure 1700 (FIGS. 17A and 17B), there are small portions of bottom epis 310 (for example, exposed area 370) that are in direct contact with substrate 302. This creates a partial connection between bottom epis 310 and substrate 302, which helps with epi growth for bottom epis 310. However, as discussed herein, too much direct contact/exposure between the bottom epis 310 and substrates 302 may cause junction leakage and parasitic junction capacitance. Therefore, the isolation layers 330 may help isolate portions of bottom epis 310 (for instance, the bottom portions of the epis 310, when viewing from the cross-sections depicted in FIGS. 18A and 18B) which may help substantially reduce/prevent junction leakage and parasitic junction capacitance (as discussed herein).

In some instances, the isolation layers 330 may be within source/drain region(s) of the stacked FET structure 1800, such as source/drain region 380 (FIG. 18A). The isolation layers 330 may be formed at bottom portions of the source/drain region(s) (380) within well(s) in the substrate 302 (such as well 325 depicted in FIG. 13A). Put differently, the isolation layers 330 may be at a bottom area of well(s) in the substrate 302 which may also be at a bottom area of source/drain region(s) (380). The bottom epi(s) 310 may be directly connected to the substrate 302 at a portion of the sidewalls of the well(s) in the substrate (such as well 325 depicted in FIG. 13A).

In some instances, as depicted in FIGS. 18A and 18B, the bottom epis 310 may have more/greater contact with the isolation layers 330 than the substrate 302, as there may only be small areas of the bottom epis 310 (such as exposed area 370) that are in direct contact with the substrate 302. In some instances, a majority (e.g., greater than 50%) of a bottom portion of the bottom epis 310 may be in contact with the isolation layers 330, whereas only a minority/small portion (e.g., less than 50%) of a bottom portion of the bottom epis 310 may be in contact with the substrate 302. In some instances, of the contact the bottom epis 310 are making with the substrate 302 and/or the isolation layers 330, 75% or more of the total contact may be with the isolation layers 330 and 25% or less of the total contact may be with the substrate 302.

Stacked FET structure 1800 may be an example structure for stacked FETs with dielectric isolation layers for partial isolation and partial connection between a bottom epi and a substrate. For example, although stacked FET structure 1800 depicts two stacked transistors, any number of transistors (and their corresponding components, such as top and bottom epis (320 and 310, respectively), isolation layers 330, contacts 340, etc.) may be used. Similarly, although stacked FET structure 1800 depicts a crescent-shaped isolation layer 330, other shapes of isolation layers 330 that are able to achieve partial isolation and partial connection between bottom epis 310 and a substrate 302 may be used.

Figure 19:
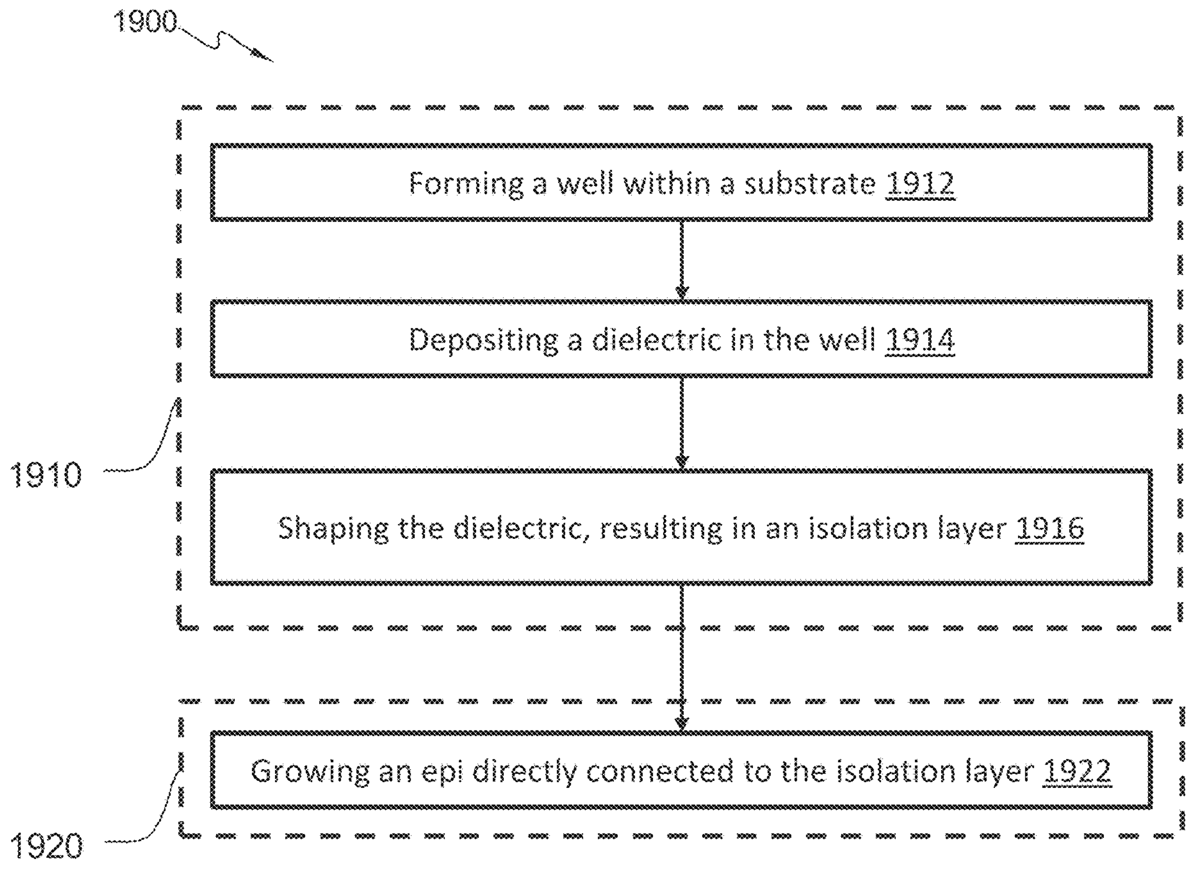
FIG. 19 depicts a flowchart of an example method of forming a stacked FET structure, according to some embodiments.

Referring now to FIG. 19, a flowchart of an example method 1900 of forming a stacked FET structure (for example, stacked FET structure 100 (FIG. 1) and/or stacked FET structure 1800 (FIGS. 18A and B) is depicted, according to some embodiments. Method 1900 depicts operation 1910 of forming an isolation layer directly connected to a substrate. As depicted in FIG. 19, forming an isolation layer may include forming a well within a substrate (operation 1912), depositing a dielectric in the well (operation 1914), and shaping the dielectric, resulting in an isolation layer (1916). In some instances, forming the well within the substrate may include recessing a portion of the substrate in a curved shape. In some instances, as discussed in relation to FIGS. 13A and B, recessing a portion of the substrate in a curved shape may include over etching the substrate (for example, using a recessing RIE process). Shaping the dielectric may include shaping the dielectric into a crescent shape, in some instances. In this instance, the shaping may include etching the dielectric such that there is an exposed portion of the well of the substrate that is not in direct contact with the dielectric. In some instances, as discussed in relation to FIGS. 15A and B, the deposition process (for example, a conformal deposition process) may help form the crescent shape for the dielectric. For instance, when the substrate is recessed in a curved shape, the dielectric (when deposited) may follow that same curved shape, which results in the top and bottom curves of the crescent shape. Once the dielectric is deposited (in operation 1914), an etch such as a wet etch may occur to remove excess dielectric and exposing a portion of the well of the substrate to not be indirect contact with the dielectric.

In some instances, forming an isolation layer (1910) may correspond with intermediate steps 1300 (FIGS. 13A and B), 1400 (FIGS. 14A and B), 1500 (FIGS. 15A and B), and 1600 (FIGS. 16A and B). In some instances, forming a well (1912) may correspond with intermediate step 1300 (FIGS. 13A and B), depositing a dielectric (1914) may correspond with intermediate step 1500 (FIGS. 15A and B), and shaping the dielectric (1916) may correspond with intermediate step 1600 (FIGS. 16A and B).

In some instances, as depicted in FIG. 19, method 1900 includes forming a transistor (operation 1920), which may include growing an epi directly connected to the isolation layer (operation 1922). In some instances, growing an epi may correspond with intermediate step 1600 (FIGS. 16A and B). In some instances, multiple epis may be grown (for example, a top epi and a bottom epi, multiple bottom epis, etc.). In some instances, forming a transistor (operation 1920) may include additional steps not depicted in FIG. 19. For example, forming a transistor (operation 1920) may include any of the intermediate steps (e.g., 300-1700 (FIGS. 3A-17B)) discussed herein in relation to forming stacked FET structure 1800 (FIGS. 18A and B).

The present invention may be a system, a method, a computer program product, etc. at any possible technical detail level of integration.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, wherein the semiconductor structure comprises:

a transistor comprising nanosheets and an epi, wherein the epi is directly connected to the nanosheets;

a substrate, wherein the epi is directly connected to the substrate; and an isolation layer directly connected to the epi and the substrate.

2. The semiconductor structure of claim 1, wherein the isolation layer is at a bottom area of a well in the substrate.

3. The semiconductor structure of claim 2, wherein the epi is connected to the substrate at sidewalls of the well.

4. The semiconductor structure of claim 1, wherein the isolation layer is a crescent shape.

5. The semiconductor structure of claim 1, wherein the isolation layer comprises at least one of SiN, SiBCN, SiOCN, SiC, and SiOC.

6. The semiconductor structure of claim 1, wherein a first portion of the epi directly connected to the isolation layer is greater than a second portion of the epi directly connected to the substrate.

7. The semiconductor structure of claim 1, wherein the transistor is a bottom transistor in a stacked transistor structure.

8. The semiconductor structure of claim 1, wherein the transistor is a nanosheet FET.

9. A system, wherein the system comprises:

a semiconductor structure, wherein the semiconductor structure comprises:

a first transistor comprising nanosheets and a first epi, wherein the first epi is directly connected to the nanosheets;

a second transistor comprising a second epi;

a substrate, wherein the first epi is directly connected to the substrate; and an isolation layer directly connected to the first epi and the substrate.

10. The system of claim 9, wherein the isolation layer is at a bottom area of a well in the substrate.

11. The system of claim 10, wherein the first epi is connected to the substrate at sidewalls of the well.

12. The system of claim 9, wherein the isolation layer is a crescent shape.

13. The system of claim 9, wherein the isolation layer comprises at least one of SiN, SiBCN, SiOCN, SiC, and SiOC.

14. The system of claim 9, wherein a first portion of the first epi directly connected to the isolation layer is greater than a second portion of the first epi directly connected to the substrate.

15. The system of claim 9, wherein the first transistor is a bottom transistor and the second transistor is a top transistor in a stacked transistor structure.

16. A method of forming a semiconductor structure, the method comprising:

forming an isolation layer directly connected to a substrate; and forming a first transistor, wherein forming the first transistor comprises:

growing a first epi, wherein the first epi is directly connected to first transistor nanosheets, the isolation layer and the substrate.

17. The method of claim 16, wherein forming the isolation layer comprises:

forming a well within the substrate;

depositing a dielectric in the well; and shaping the dielectric, resulting in the isolation layer.

18. The method of claim 17, wherein forming the well within the substrate comprises:

recessing a portion of the substrate in a curved shape.

19. The method of claim 17, wherein the isolation layer is a crescent shape.

20. The method of claim 19, wherein shaping the dielectric comprises:

shaping the dielectric into a crescent shape, wherein the shaping comprises:

etching the dielectric such that there is an exposed portion of the well of the substrate that is not in direct contact with the dielectric.

* * * * *